(12) United States Patent  
Ueda

(10) Patent No.: US 7,449,967 B2  
(45) Date of Patent: Nov. 11, 2008

(54) PROBABILISTIC PULSE GENERATOR AND DIFFERENTIAL ABSOLUTE VALUE COMPUTING ELEMENT AND MANHATTAN DISTANCE ARITHMETIC UNIT USING THIS

(75) Inventor: Michihito Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 488 days.

(21) Appl. No.: 10/532,993

(22) PCT Filed: Mar. 1, 2004

(86) PCT No.: PCT/JP2004/002480

§ 371 (c)(1),  
(2), (4) Date: Sep. 30, 2005

(87) PCT Pub. No.: WO2004/077669

PCT Pub. Date: Sep. 10, 2004

(65) Prior Publication Data

US 2006/0155551 A1    Jul. 13, 2006

(30) Foreign Application Priority Data

Feb. 28, 2003  (JP) .............................. 2003-052827  
Apr. 17, 2003  (JP) .............................. 2003-112353

(51) Int. Cl.  
*G01S 3/803* (2006.01)

(52) U.S. Cl. ........................... 331/78; 367/126; 708/250

(58) Field of Classification Search .................... 331/78; 708/250, 255; 367/124–126  
See application file for complete search history.

(56) References Cited

U.S. PATENT DOCUMENTS

| 4,136,326 A | * | 1/1979 | Naudot et al. ................. 367/39 |
| 2004/0162725 A1 | * | 8/2004 | Ueda et al. .................. 704/236 |

FOREIGN PATENT DOCUMENTS

| JP | 48-102557 | 12/1973 |
| JP | 48-102557 A | 12/1973 |
| JP | 51-111041 | 10/1976 |
| JP | 62-264717 | 11/1987 |
| JP | 5-243922 | 9/1993 |
| JP | 8-265109 | 10/1996 |

* cited by examiner

*Primary Examiner*—Benny Lee  
*Assistant Examiner*—James E Goodley  
(74) *Attorney, Agent, or Firm*—McDermott Will & Emery LLP

(57) ABSTRACT

A stochastic pulse generator (1) of this invention includes a variable signal generator (61) operative to generate a variable signal ($V_C$) which varies randomly, and a comparator (3) operative to output a binary signal ($V_{out}$) of High or Low depending on which of one input signal and another input signal is larger or smaller than the other, wherein when the variable signal ($V_C$) is inputted, as the one input signal, to the comparator (3) from the variable signal generator (61), the comparator (3) stochastically outputs pulses, the number of which corresponds to a magnitude of the another input signal.

4 Claims, 35 Drawing Sheets

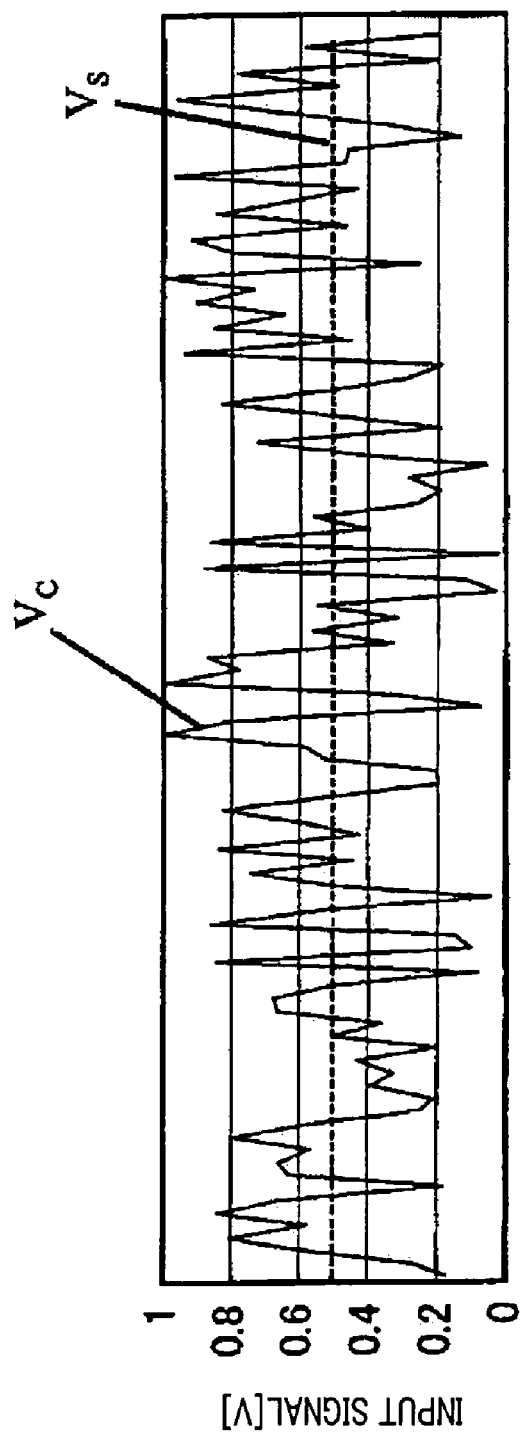
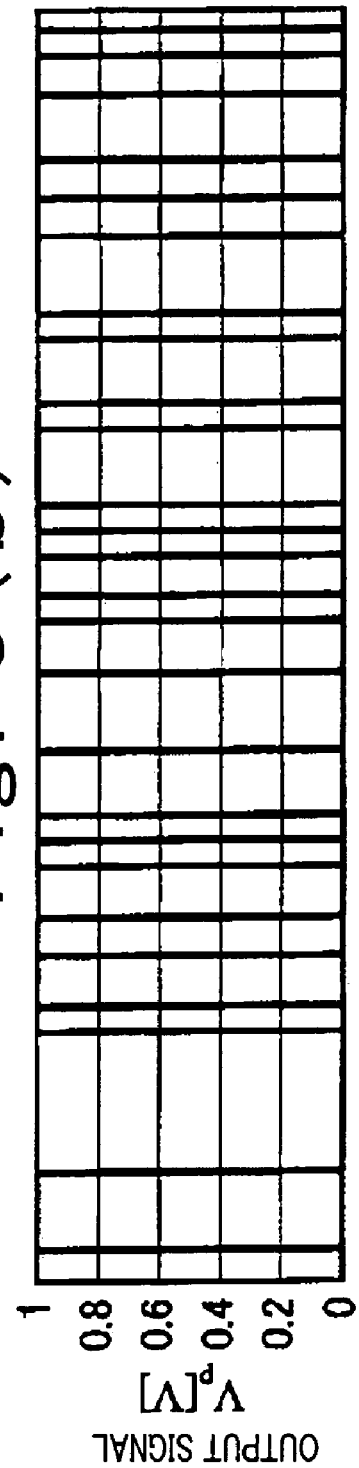

Fig. 20(a) $V_S \leq 2/3$
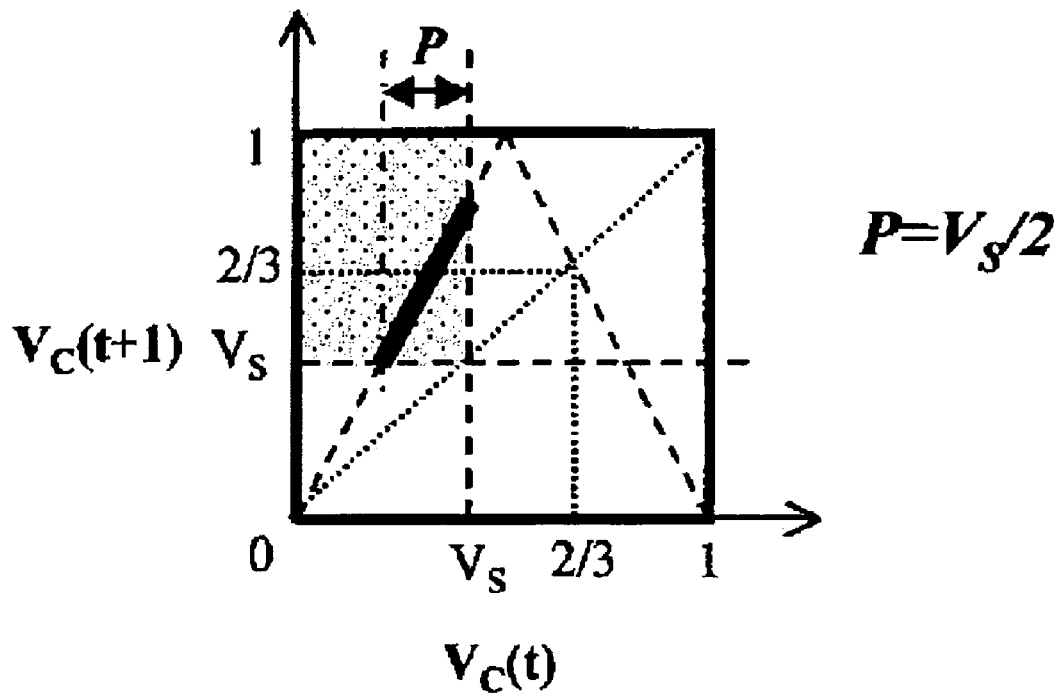
$P = V_S/2$
Fig. 20(b) $V_S \geq 2/3$
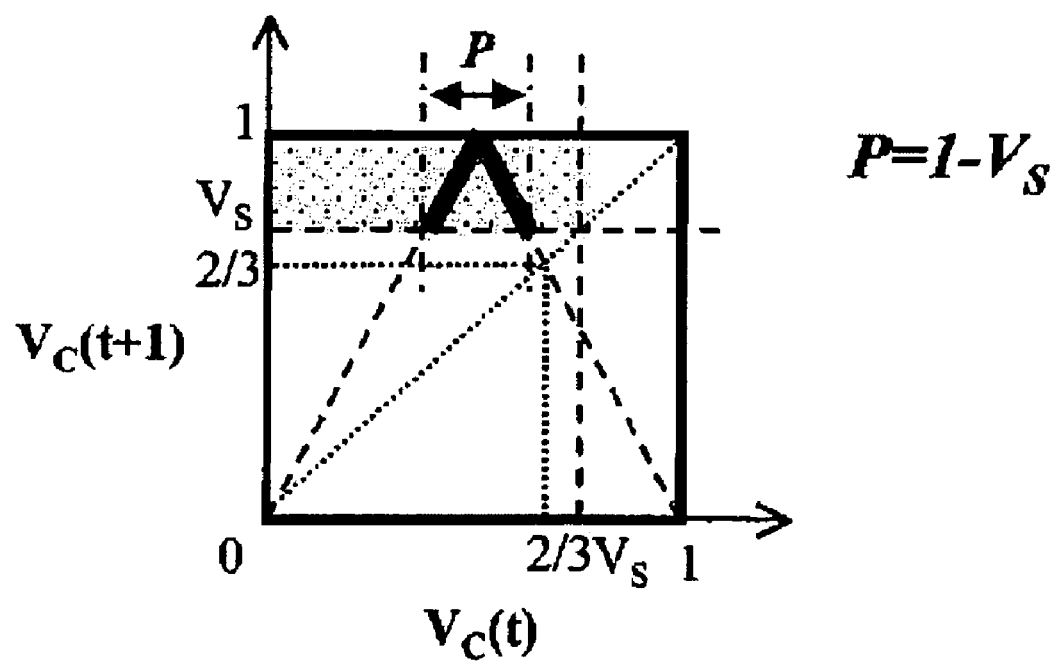
$P = 1 - V_S$

Fig. 23(a) $V_S \leq 1/2$
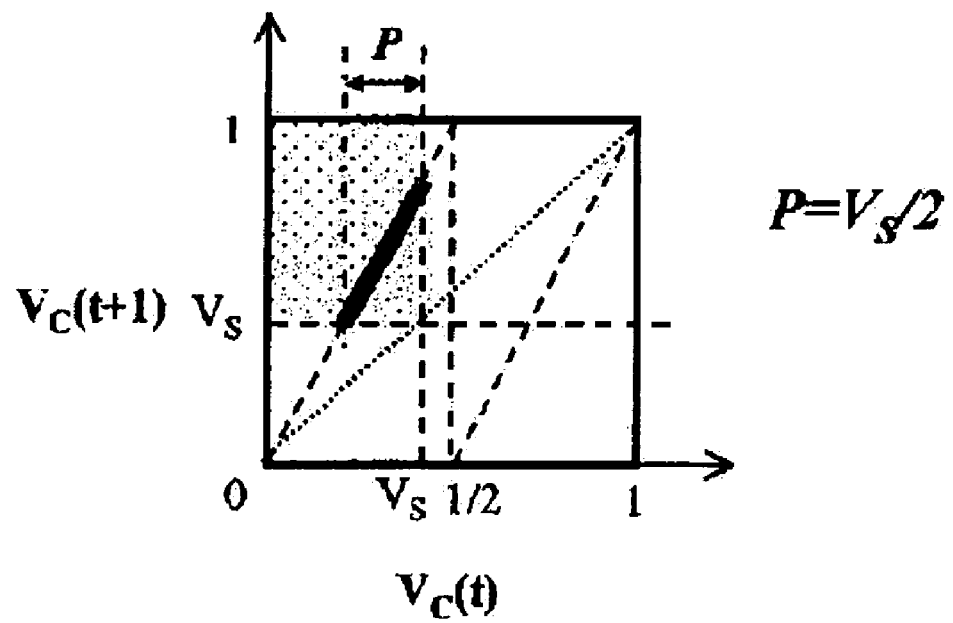
$P = V_S/2$
Fig. 23(b) $V_S \geq 1/2$
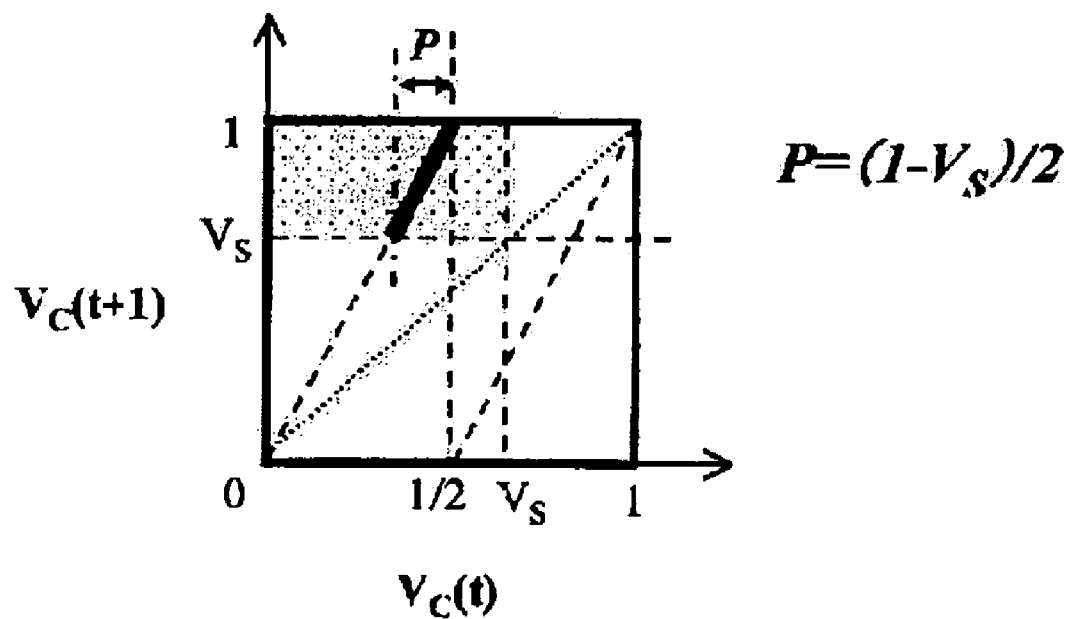
$P = (1-V_S)/2$ Fig. 26(a) V₁ STORAGE
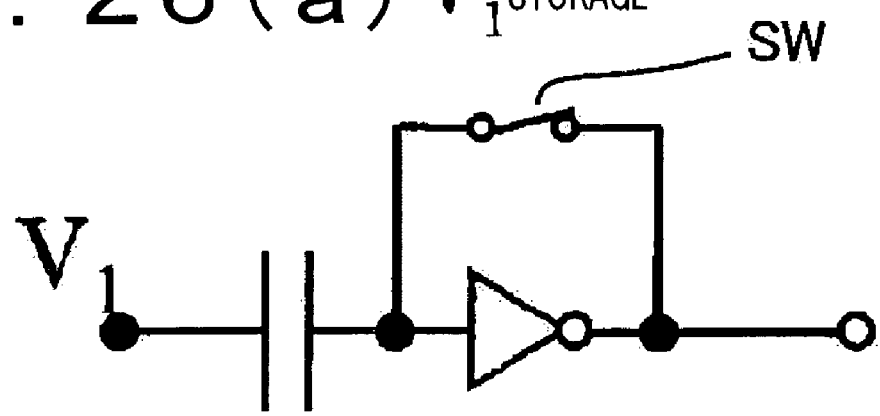
Fig. 26(b) COMPARISON
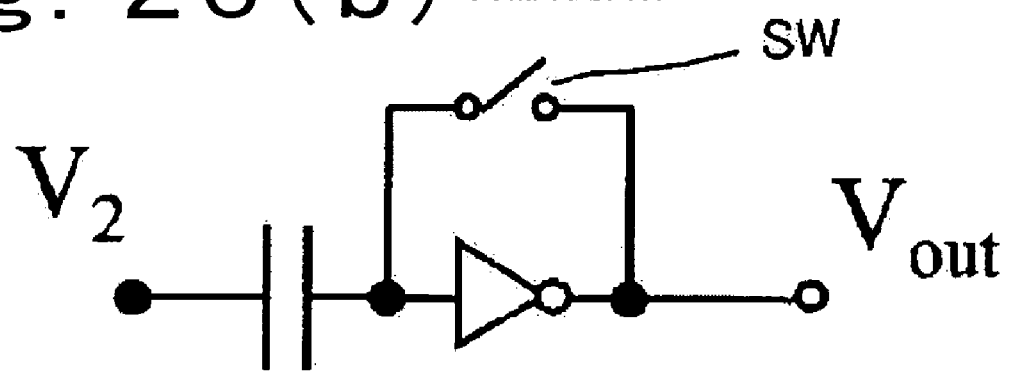

PROBABILISTIC PULSE GENERATOR AND DIFFERENTIAL ABSOLUTE VALUE COMPUTING ELEMENT AND MANHATTAN DISTANCE ARITHMETIC UNIT USING THIS

TECHNICAL FIELD

The present invention relates to a stochastic pulse generator operative to stochastically generate pulses, the number of which corresponds to the magnitude of an analog voltage, an absolute difference processor employing the same, and a Manhattan distance processing apparatus employing the same.

BACKGROUND ART

It is generally considered to be common knowledge in the art so-called signal processing that if signals are mixed with noise, the S/N ratio becomes worse and the original signals become difficult to obtain. However, creatures in the natural world are living while processing signals mixed with much noise at very low power consumption. The phenomenon called "stochastic resonance" has been found as one of important mechanisms of such signal processing. The stochastic resonance phenomenon is that in a noise-given bistable system there are some cases where the S/N ratio is improved contrary to expectation.

One conventional art attempting to apply such a phenomenon to the industries (hereinafter will be referred to as "first conventional art") is "METHOD AND APPARATUS FOR DETECTING A SPATIO-TEMPORAL PATTERN, AND RECORDING MEDIUM" described in Japanese Patent Laid-Open Publication No. 2000-3350 for example.

FIG. 13 illustrates a method of detecting detected signals according to the first conventional art. The method described in the first conventional art is to detect signals mixed with noise using an operation method called neural network.

According to the method illustrated in FIG. 13, first of all, the neural network learns a noise-free pattern at steps 101 and 102; thereafter, a noise-mixed signal is inputted to the neural network at step 103; further, stochastic resonance is caused to occur at step 104; and, thereafter, Fourier transformation is performed to find a characteristic frequency peak at step 106, thereby finding the frequency of the original signal from the noise-mixed signal.

The detection method of the first conventional art, however, does not disclose any definition of what in the world the "noise" is. For example, when noise contains an intensive frequency component, this component is undesirably analyzed at the final frequency peak detection step, thus resulting in a problem of inaccurate detection.

Meanwhile, with the recent widespread use of personal computers (PCs), semiconductor devices also find home use significantly widely and hence find increasing personal uses not only for simple numerical operations but also for Internet, mail, image processing and the like.

However, PCs, which have become capable of such high-speed processing, cannot perform all operations at sufficient speed. For example, such processing as to recognize human voices or languages or identify a person on camera requires an enormous amount of operations. For this reason, realtime processing is difficult.

Such recognition processing is based on processing including: vectorizing stored information on voices or faces for example into reference vectors to be stored; likewise, vectorizing inputted information into an inputted vector; detecting similarities between the inputted vector and each of the reference vectors; and performing an operation to find which of the reference vectors is most proximate to the inputted vector. Such vector comparison processing is fundamental processing that can be utilized in a wide variety of information processing including associative storage, quantization of vectors, pattern recognition for motion prediction for example, and data compression.

Such vector comparison requires a massive amount of operations in any application. Further, von Neumann type computers, representative of which are PCs, cannot extract the most proximate vector until all vector comparison operations have been completed because of their operating principle and, as a result, extraction of the most proximate vector requires a very long time.

A conventional device (hereinafter will be referred to as "second conventional art") based on a new concept for computing the "proximity" between plural numeric values (between a set of numeric values and another set of numeric values) at higher speed is described in, for example, "A CMOS Stochastic Associative Processor Using PWM Chaotic Signals", IEICE Transactions on Electronics, Vol. E84-C, No. 12, December 200, pp. 1723-1729.

FIG. 34 illustrates the configuration of a distance processing apparatus according to the second conventional art.

The distance processing apparatus shown in FIG. 34 is an apparatus for stochastically processing the match/mismatch between digital data. When input data 101 matches with stored data 103 (both of the two are 1 or 0), XNOR circuit 120 outputs 1. To the output side of the XNOR circuit 120 is connected PWR chaos generator 121 for varying the pulse width chaotically. When latch signal 105 is inputted to latch circuit 122 after a certain time period after PWAM chaos has been generated, the value inputted at that time is held. Since the signal having a chaotically variable width is inputted to the latch circuit 122, an operation by which the value held by the latch circuit 122 becomes High is a stochastic operation. When High is held, switch 109 is turned ON to feed current from current source 107. By detecting the total sum of such currents and then performing comparison by high-order value extraction circuit 111, the sum of currents detected becomes stochastically larger as a group of input data 101 and a group of stored data 103 become more proximate to each other. Thus, the proximity between vectors (a humming distance in this case) can be calculated stochastically. Note that the second conventional art uses so-called logistic chaos as shown in the map of FIG. 35.

However, the distance processing apparatus of the second conventional art can only perform comparison between two values since the apparatus compares digital information. This means that the apparatus, as it is, operates only as a humming distance processing apparatus. Therefore, in comparing multiple-bit information the apparatus needs to perform comparisons between two values a number of times corresponding to the number of bits. This is not efficient.

Further, because the comparison of binary information (i.e., distance processing) is completed by XNOR, the introduction of chaos thereafter to obtain a chaotic solution is disadvantageous in terms of energy efficiency. Thus, the distance processing apparatus which processes digital information only cannot be expected to operate at reduced energy consumption.

DISCLOSURE OF INVENTION

A first object of the present invention is to provide a processor capable of extracting a frequency component of an original signal from a noise-containing signal.

A second object of the present invention is to provide a processor capable of processing a Manhattan distance while reducing energy consumption.

As a result of study to attain these objects, the inventor of the present invention have found that it is very important to control a random signal which is described as noise in the conventional art in applications of stochastic resonance to the industries. As a device embodying this idea and attaining the first object, the inventor has invented a stochastic pulse generator capable of controlling the pulse generation probability to a desired probability.

The inventor has further found that by the use of this stochastic pulse generator the second object to provide a processor capable of processing a Manhattan distance while reducing energy consumption can be attained.

That is, a stochastic pulse generator according to the present invention comprises a variable signal generator operative to generate a variable signal which varies randomly, and a comparator operative to output a binary signal of High or Low depending on which of one input signal and another input signal is larger or smaller than the other, wherein when the variable signal is inputted as said one input signal to the comparator from the variable signal generator, the comparator stochastically outputs pulses, the number of which corresponds to a magnitude of said another input signal.

The variable signal generator may be operative to generate, as the variable signal, a control random signal statistically having a histogram in terms of its magnitude and a statistical histogram of the pulses is controlled based on a distribution of the histogram of the control random signal.

Said another input signal may contain at least a periodic signal as a component thereof.

It is possible that the variable signal generator has a storage device and is operative to generate the control random signal by digital/analog conversion of random number digital data having a predetermined histogram stored in the storage device.

The random number digital data having the predetermined histogram may be obtained by an inverse transformation method or a rejection method.

It is possible that: the control random signal contains a frequency component higher than a frequency band of the periodic signal contained in said another input signal; the pulse generator has a low-pass filter for blocking a frequency band higher than the frequency band of the periodic signal; and the pulses outputted from the comparator are inputted to the low-pass filter. This arrangement can enhance the periodic signal detectability.

The variable signal generator may be operative to generate a random variable signal having a histogram becoming uniform in at least an infinite time. With this arrangement, the pulse generation probability is rendered linear relative to the another input signal.

The variable signal may be chaos of a tent map.

The variable signal may be chaos of a Bernoulli shift map.

The variable signal may be uniform random numbers.

The comparator may be an analog comparator.

The comparator may be a chopper type CMOS comparator.

It is possible that said another input signal is inputted to and held by the chopper type CMOS comparator and then the variable signal is inputted to the chopper type CMOS comparator subsequently.

An absolute difference processor according to the present invention comprises: first and second stochastic pulse generators each comprising a stochastic pulse generator as recited in claim 1; and an exclusive-OR circuit for outputting an exclusive-OR of an output of the first stochastic pulse generator and an output of the second stochastic pulse generator; wherein when said another input signal and the variable signal which are inputted to the first stochastic pulse generator are $V_{S1}$ and $V_{C1}$, respectively, while the output of the first stochastic pulse generator is $V_{O1}$ and; said another input signal and the variable signal which are inputted to the second stochastic pulse generator are $V_{S2}$ and $V_{C2}$, respectively, while the output of the second stochastic pulse generator is $V_{O2}$, the variable signals $V_{C1}$ and $V_{C2}$ are the same variable signal: thereby obtaining an absolute difference between the value of said another input signal $V_{S1}$ and that of said another input signal $V_{S2}$ in the form of a number of stochastic pulses comprising the exclusive-OR.

The stochastic pulses comprising the exclusive-OR may be generated with a pulse generation probability which lowers with decreasing absolute difference between the value of said another input signal $V_{S1}$ and that of said another input signal $V_{S2}$.

The variable signals $V_{C1}$ and $V_{C2}$ may be generated to repeat the same progression.

A Manhattan distance processing apparatus according to the present invention comprises a plurality of absolute difference processors as recited in claim 14 which are connected in parallel with the single variable signal generator, wherein signals corresponding to elements of respective of two vectors each having the elements, a number of which corresponds to the number of the absolute difference processors, are inputted as said another input signal $V_{S1}$ and said another input signal $V_{S2}$ to each of the absolute difference processors, thereby obtaining a Manhattan distance between the two vectors in the form of number of stochastic pulses. This configuration is capable of preventing inversion of a Manhattan distance operation which would otherwise occur due to stochastic generation of pulses.

A stochastic pulse generator driving method according to the present invention is a driving method for a stochastic pulse generator including a comparator operative to output a binary signal of High or Low depending on which of one input signal and another input signal is larger or smaller than the other, the method comprising inputting a randomly variable signal as said one input signal to the comparator to cause the comparator to stochastically output pulses, the number of which corresponds to a magnitude of said another input signal.

The foregoing and other objects, features and advantages of the present invention will become apparent from the following detailed description of the preferred embodiments to be read with reference to the accompanying drawings.

BRIEF DESCRIPTION OF DRAWINGS

FIGS. 5(a) and 5(b) are graphs showing an operation of the stochastic pulse generator shown in FIG. 1.

FIGS. 20(a) and 20(b) are schematic diagrams illustrating the principle of a pulse generation probability calculation executed by the stochastic pulse generator according to embodiment 4 of the present invention.

FIGS. 23(a) and 23(b) are schematic diagrams illustrating the principle of a pulse generation probability calculation executed by the stochastic pulse generator according to embodiment 5 of the present invention.

FIGS. 26(a) and 26(b) are circuit diagrams for illustrating the operation of a chopper type CMOS comparator forming part of the stochastic pulse generator according to embodiment 6 of the present invention.

BEST MODE FOR CARRYING OUT THE INVENTION

Hereinafter, embodiments of the present invention will be described with reference to the drawings.

Embodiment 1

Figure 1:
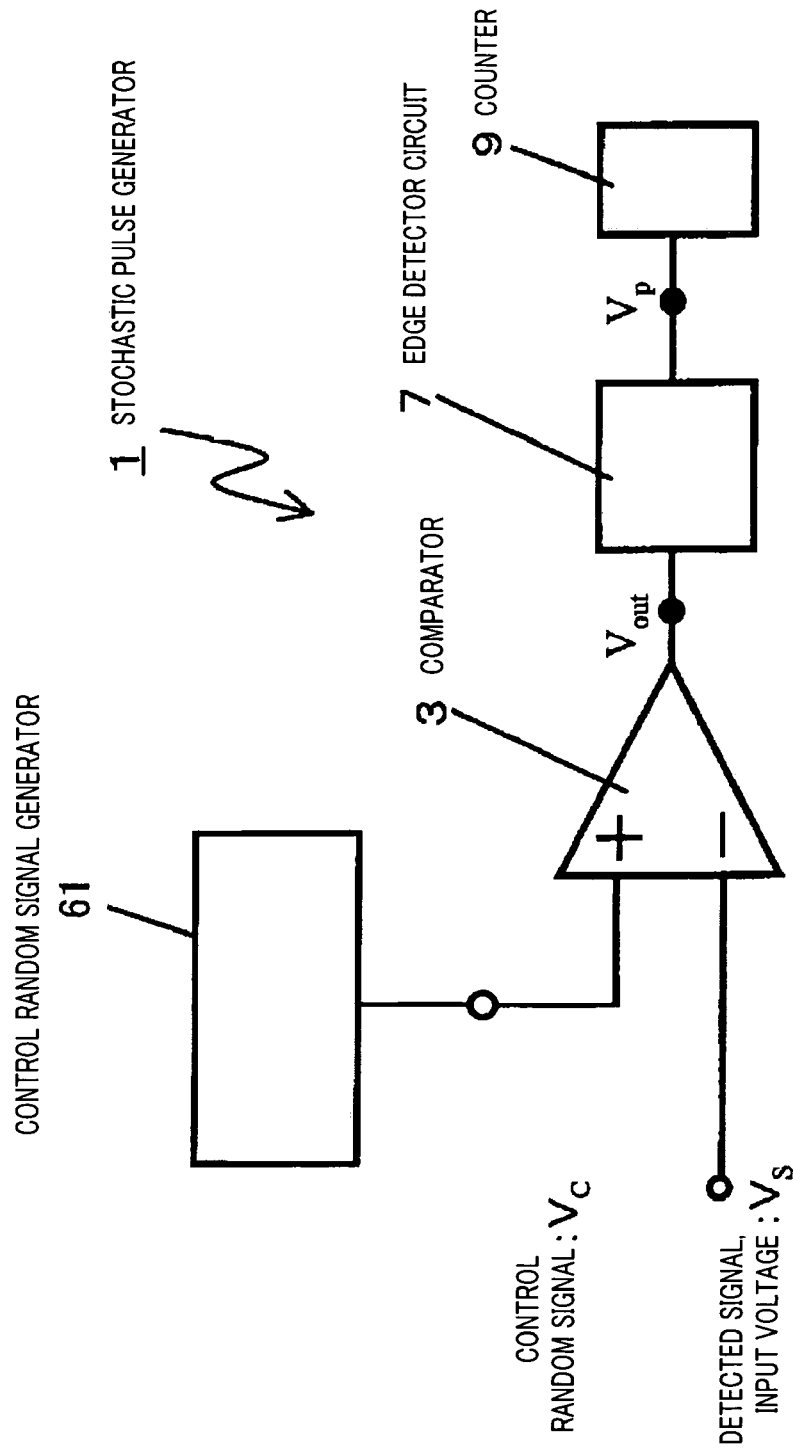
FIG. 1 is a circuit diagram showing the configuration of a stochastic pulse generator according to embodiment 1 of the present invention.

FIG. 1 is a circuit diagram showing an example of the configuration of a stochastic pulse generator according to embodiment 1 of the present invention.

In FIG. 1, stochastic pulse generator 1 has a control random signal generator 61, a comparator 3, an edge detector 7, and a counter 9. Control random signal $V_C$ generated by the control random signal generator 61 is inputted to the plus input terminal of the comparator 3, while a detected signal $V_S$ inputted to the minus input terminal. The comparator 3 outputs a binary pulse according to the difference of control signal $V_C$ from the detected signal. The edge detector 7 detects the leading edge of each pulse outputted from the comparator 3 and then outputs pulses of equal width. The counter 9 counts the number of pulses outputted from the edge detector 7 by detecting, for example, the leading edges of these pulses.

Detailed description will be made of the configurations of the respective components.

Figure 2:
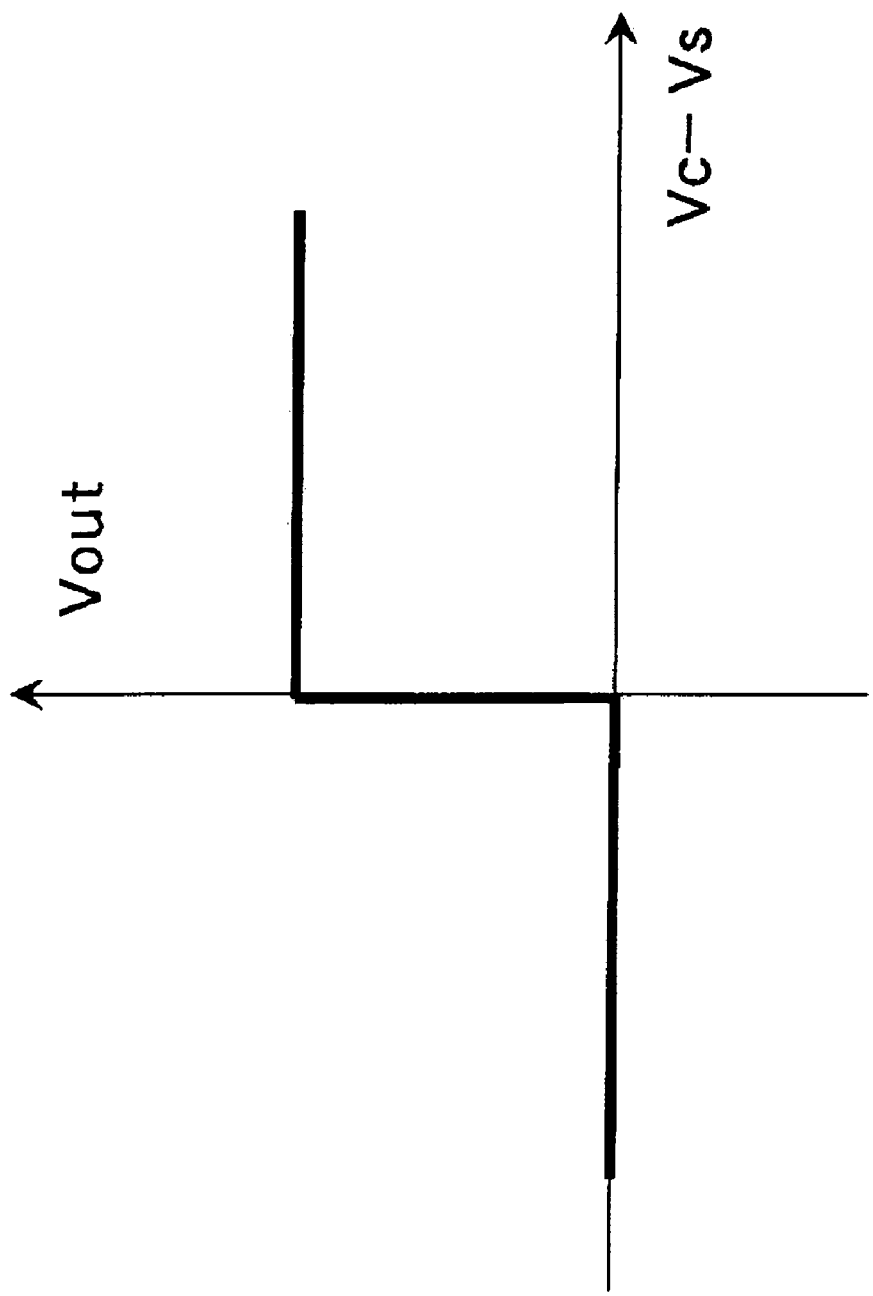
FIG. 2 is a graph plotting a characteristic of a comparator of the stochastic pulse generator shown in FIG. 1.

FIG. 2 is a graph plotting the input-output characteristic of the comparator 3. The comparator 3 has an input-output characteristic as shown in FIG. 2. When a voltage inputted to the plus terminal (i.e., control random signal $V_C$ in this embodiment) becomes higher than a voltage inputted to the minus terminal (i.e., detected signal $V_S$ in this embodiment), output voltage $V_{out}$ becomes "High" level (hereinafter will be referred to as "High" simply), whereas in the converse case the output voltage $V_{out}$ becomes "Low" level (hereinafter will be referred to as "Low" simply). That is, the output $V_{out}$ of the comparator 3 is a binary voltage signal which varies like a pulse by at least one up-and-down between High and Low. In this embodiment, the output voltage $V_{out}$ of High is set to be 1[V] and the output voltage $V_{out}$ of Low set to be 0[V].

A device called analog comparator may be used as the comparator 3. More specifically, an operational amplifier or a latch circuit may be used.

While control random signal $V_C$ and detected signal $V_S$ are inputted to the plus input terminal and the minus input terminal, respectively, of the comparator 3 in this embodiment, it is needless to say that a similar operation will result even in a reverse arrangement.

Figure 3:
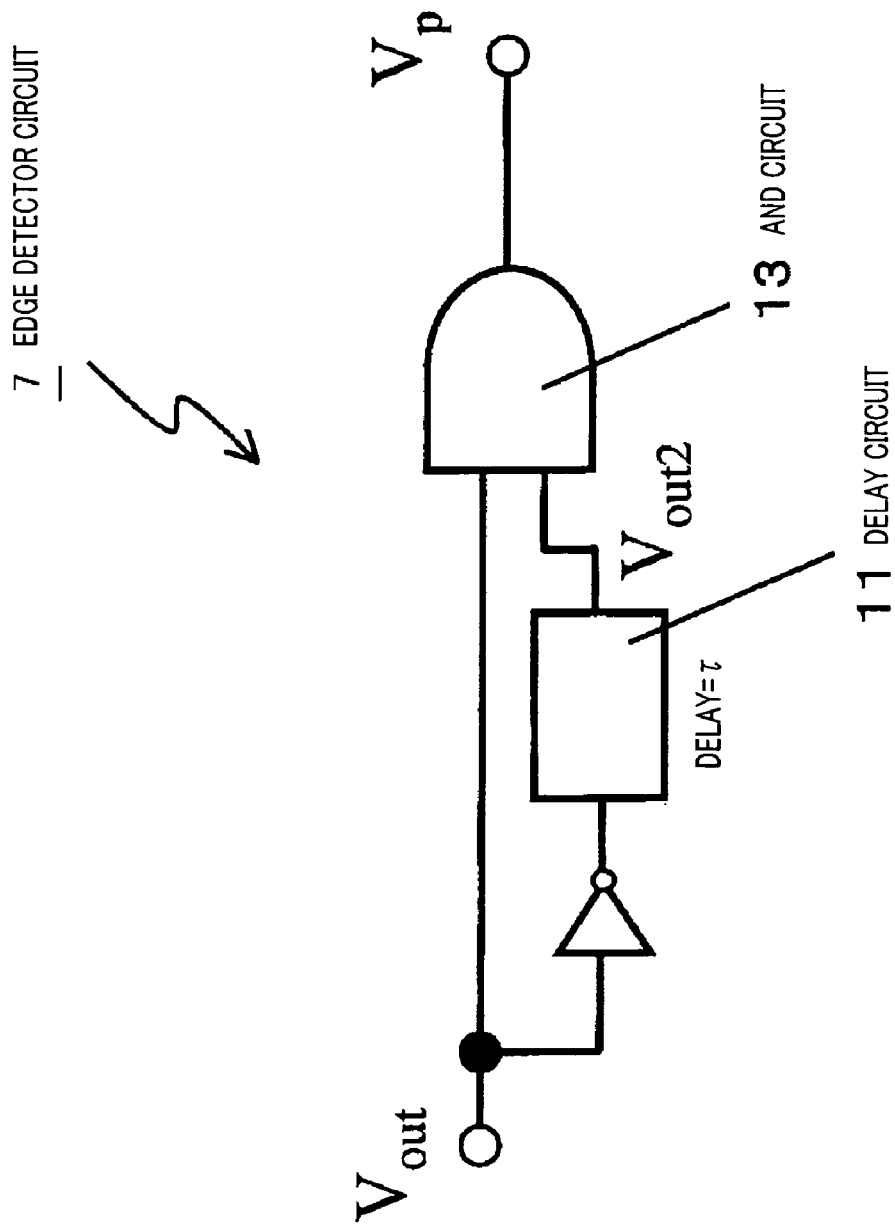
FIG. 3 is a circuit diagram showing an example of the configuration of an edge detector of the stochastic pulse generator shown in FIG. 1.

FIG. 3 is a circuit diagram of an example of the configuration of the edge detector 7 shown in FIG. 1.

Referring to FIG. 3, the edge detector 7 has an AND circuit 13. To the AND circuit 13 are inputted the output $V_{out}$ of the comparator 3 and an inverted and delayed output $V_{out2}$ resulting from inversion of the output $V_{out}$ of the comparator 3 and a delay of a predetermined time by a delay circuit 11. The AND circuit 13 operates a logical product of the output $V_{out}$ of the comparator 3 and inverted and delayed output $V_{out2}$ thus inputted thereto and then outputs the resulting logical product as a voltage $V_P$.

Figure 4:
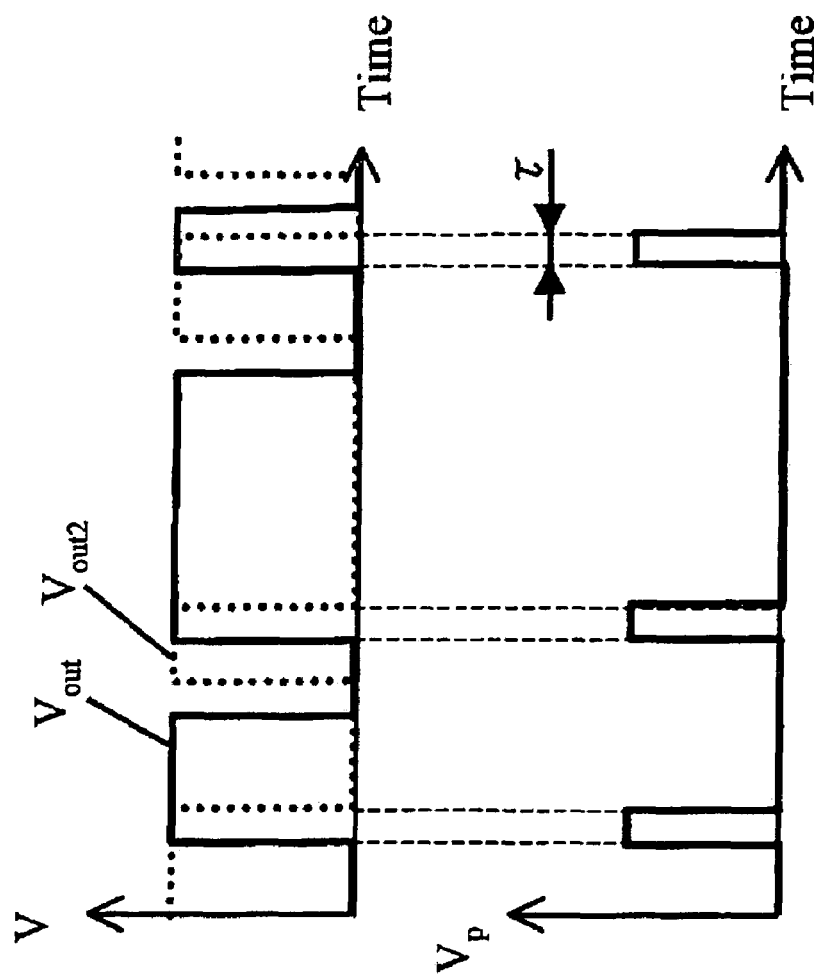
FIG. 4 is a graph showing an operation of the edge detector shown in FIG. 3.

FIGS. 4(a) and 4(b) are waveform charts showing an operation of the edge detector 7 shown in FIG. 3.

In FIG. 4(a), the output $V_{out}$ of the comparator 3 shown by a solid line is inputted to one input terminal of the edge detector 7, while the inverted and delayed output $V_{out2}$ resulting from inversion and delay by a delay time τ of the output $V_{out}$ of the comparator 3 is inputted to the other input terminal as shown by a dashed line. As shown in FIG. 4(b), the AND circuit 13 operates a logical product of the output $V_{out}$ of the comparator 3 and the inverted and delayed output $V_{out2}$ and then outputs the resulting logical product of the operation as the output voltage $V_P$. The output voltage $V_P$ becomes High when the output $V_{out}$ of the comparator 3 and the inverted and delayed output $V_{out2}$ match with each other and becomes Low in other cases. It can be understood that in the output voltage $V_P$ a pulse is generated at the time when each of pulses of the output $V_{out}$ of the comparator 3 rises (that is, edge (i.e., leading edge) detection is performed), while the pulse of the output voltage $V_P$ has a width corresponding to the delay time τ of the delay circuit 11. The provision of the edge detector 7 allows the counter 9 shown in FIG. 1 to count the number of generated pulses stably.

The control random signal generator 61 includes, for example, a processor comprising an LSI and generates a control random signal by execution of various operations to be described later for example. Detailed description of the control random signal will be made later.

With reference to FIGS. 5(a) and 5(b), description will be made of the operation of the stochastic pulse generator 1 thus configured.

FIG. 5(a) is a graph showing waveforms of control random signal $V_C$ and detected signal $V_S$ as inputs to the stochastic pulse generator 1. Note that FIG. 5(a) depicts the case where detected signal $V_S$ is a constant voltage for easy understanding of the principle.

Referring to FIGS. 1 to 5, when control random signal $V_C$ and detected signal $V_S$ as shown in FIG. 5(a) are inputted to the comparator 3, the comparator 3 outputs High voltage $V_{out}$ if the control random signal $V_C$ is larger than the detected signal $V_S$ or outputs Low voltage $V_{out}$ if the relation is converse, according to the characteristic of the comparator 3 shown in FIG. 2.

When voltage $V_{out}$ is inputted to the edge detector 7, the edge detector 7 outputs voltage $V_P$ having pulses of a fixed width τ when voltage $V_{out}$ rises from Low to High. The counter 9 in turn counts the number of pulses of voltage $V_P$ thus outputted.

Based on the operation principle described above, pulses are randomly outputted according to detected signal $V_S$ in the time domain in which a certain control random signal $V_C$ is inputted, with the number of these pulses outputted corresponding to the magnitude of the detected signal $V_S$.

However, it has been considered very difficult to control a stochastic device driven with such a random control signal $V_C$. This difficulty can be understood even from the fact that the conventional art cannot define noise.

On the basis of following considerations, the inventor of the present inventions found a stochastic pulse generator driving method which is capable of statistically controlling the entirety of such a stochastic system by controlling the distribution density of random control signal $V_C$.

Figure 6:
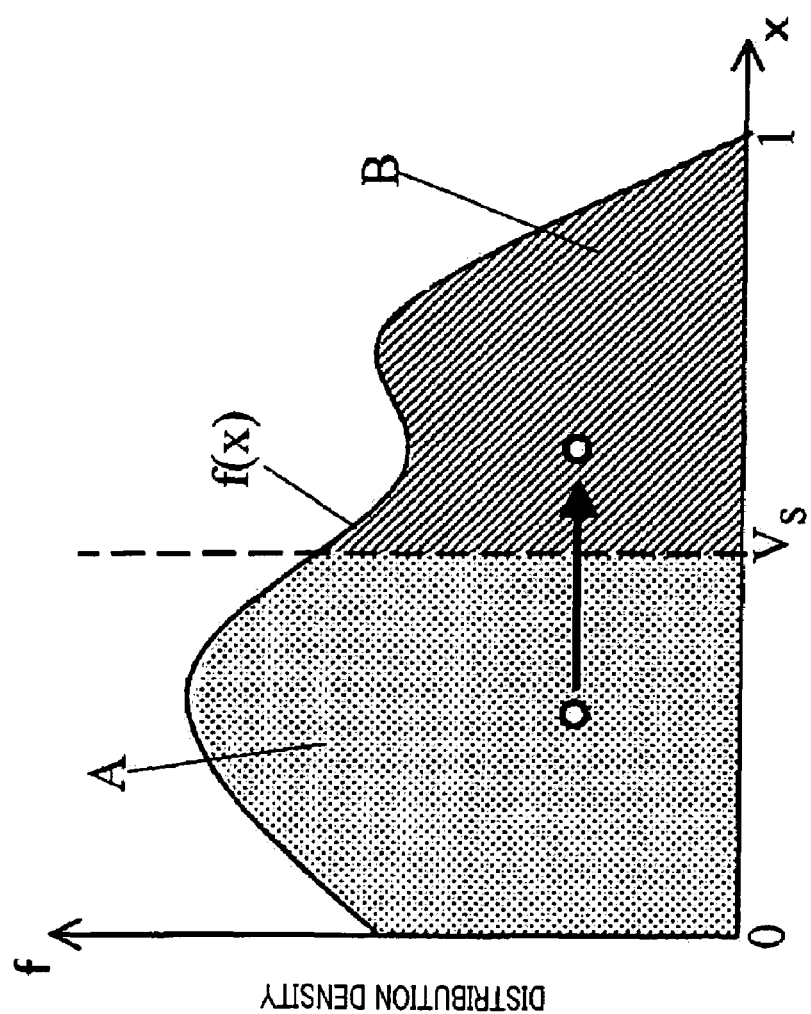
FIG. 6 is a schematic diagram for illustrating the pulse generation probability of the stochastic pulse generator shown in FIG. 1.
Figure 7:
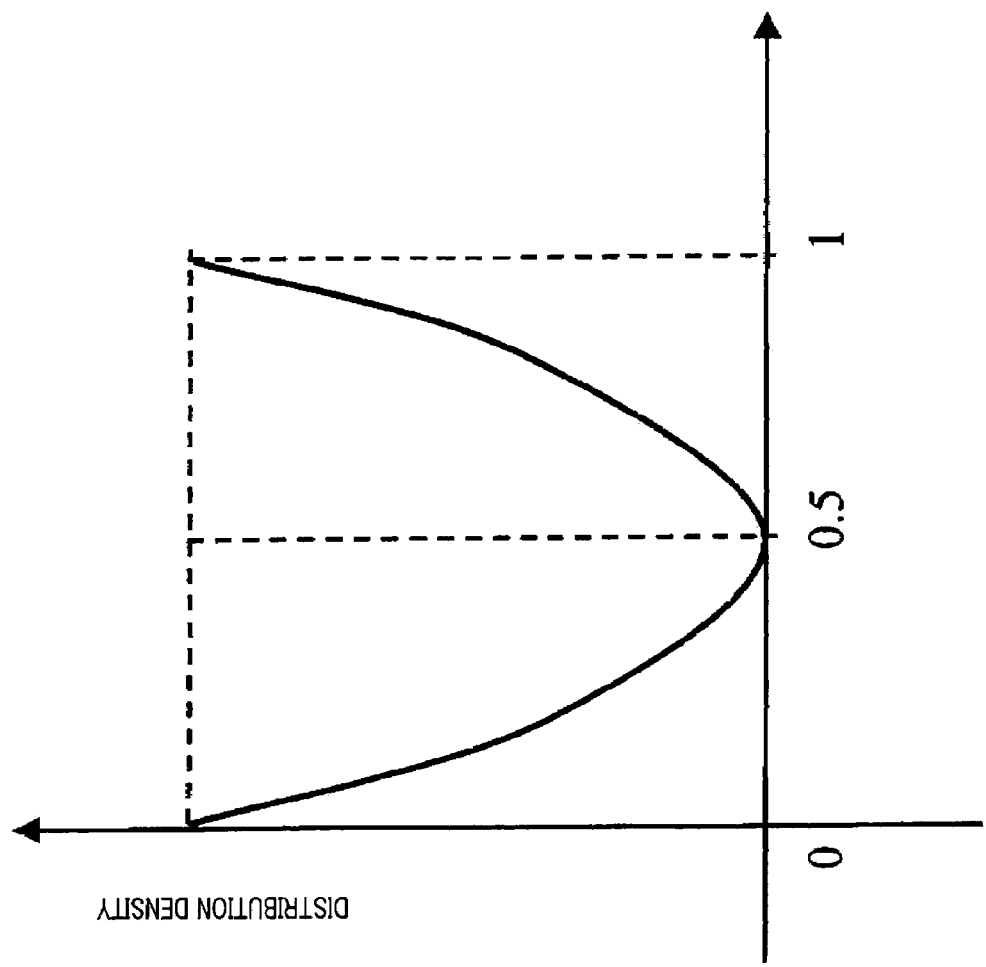
FIG. 7 is a graph for illustrating an example of obtaining a control random signal in embodiment 1 of the present invention.

FIG. 6 is a graph illustrating the principle of pulse number control. The stochastic pulse generator 1 according to this embodiment 1 generates pulses when control random signal $V_C$ makes transition from a state where it is smaller than detected signal $V_S$ to a state where it is larger than detected signal $V_S$ and counts these pulses. FIG. 6 depicts the case where control random signal $V_C$ is statistically controlled to have a distribution density represented by f(x). Note that the following description is directed to the case where detected signal $V_S$ and control random signal $V_C$ each take a value not less than 0(V) and not more than 1(V).

Referring for example to the case of FIG. 6 as an example of the pulse generation principle, when detected signal $V_S$ takes a value represented by "$V_S$" on the horizontal axis (X-axis), an output of pulses is probable only in the case where control random signal $V_C$ is present in domain A of FIG. 6 and then varies to a value within domain B. Therefore, the probability P can be calculated from the following formula:

$$P = \frac{S_A S_B}{(S_A + S_B)^2}$$

wherein $S_A$ and $S_B$ represent the area of domain A and the area of domain B, respectively. Hereinafter, this formula will be referred to as formula (1). Note that $$S_A + S_B = \int_{x=0}^{1} f(x)dx = 1$$

This formula will be referred to as formula (2). Therefore, from formula (1) and formula (2), it can be seen that $$P = S_A S_B = S_A(1-S_A)$$

Hereinafter, this formula will be referred to as formula (3). Substituting the value calculated from the formula (4):

$$S_A = \int_{x=0}^{V_S} f(x)dx$$

into the formula (3) yields a pulse generation probability as a function of detected signal $V_S$.

The next description is directed to an example of a method of creating a control random signal train which enables the statistic pulse generation probability (distribution density) to be known.

Generally, random numbers which occur in a so-called programming language are random numbers having a statistically uniform distribution density in terms of magnitude. A method called inverse transformation can execute calculation, with the use of this uniform random numbers, for yielding random numbers having a distribution density of a function which is continuous as shown in FIG. 6 and of which integral function is calculable.

The inverse transformation method includes finding any desired area S(x) by causing uniform random numbers of an interval [0, 1] to occur and then finding x by integration from a so as to give an area equal to the area S(x).

Uniform random numbers R are expressed by the formula:

$$R = S(x) = \int_{a=x_{min}}^{x} f(a)da$$

Hereinafter, this formula will be referred to as formula (5). Solving the formula (5) for x can give random numbers in a desired form.

The following description is directed to calculation for obtaining a distribution function of a quadratic function which becomes 0 when x=0.5 and takes a maximum value when x=0 and when x=1.

First, since the integral of the histogram is 1, the quadratic function is uniquely defined by the following formula (6):

$$p(x)=3(1-2x)^2$$

Substituting the formula (6) into the formula (5) yields the formula:

$$R = S(x) = \int_{a=x_{min}}^{x} \{3(1-2a)^2\}da$$

Hereinafter, this formula will be referred to as formula (7). Assume that $X_{min}=0$, it follows that $$R = \frac{1-(1-2x)^3}{2}$$

Hereinafter, this formula will be referred to as formula (8). If the formula (8) is solved inversely, it follows that $$x = \frac{1-(1-2R)^{\frac{1}{3}}}{2}$$

Hereinafter, this formula will be referred to as formula (9).

Figure 8:
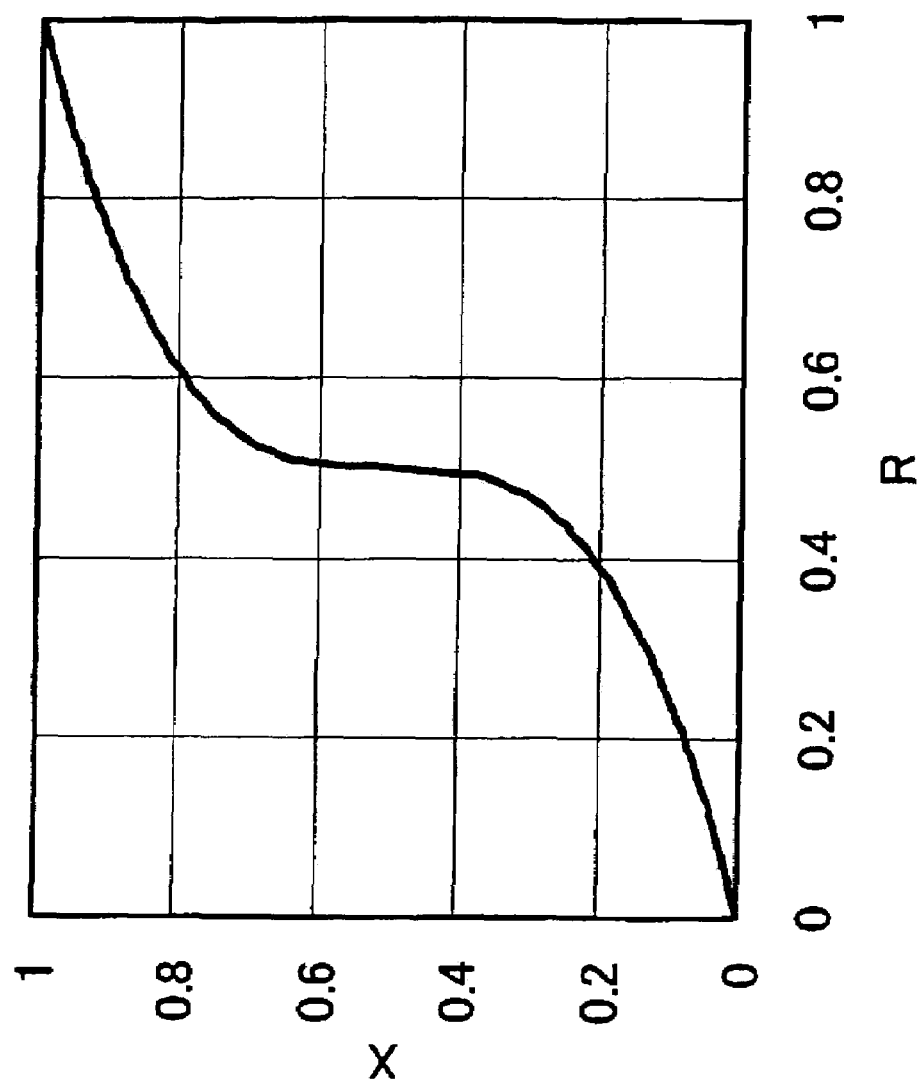
FIG. 8 is a graph plotting an example of a control random signal generation function in embodiment 1 of the present invention.
Figure 9:
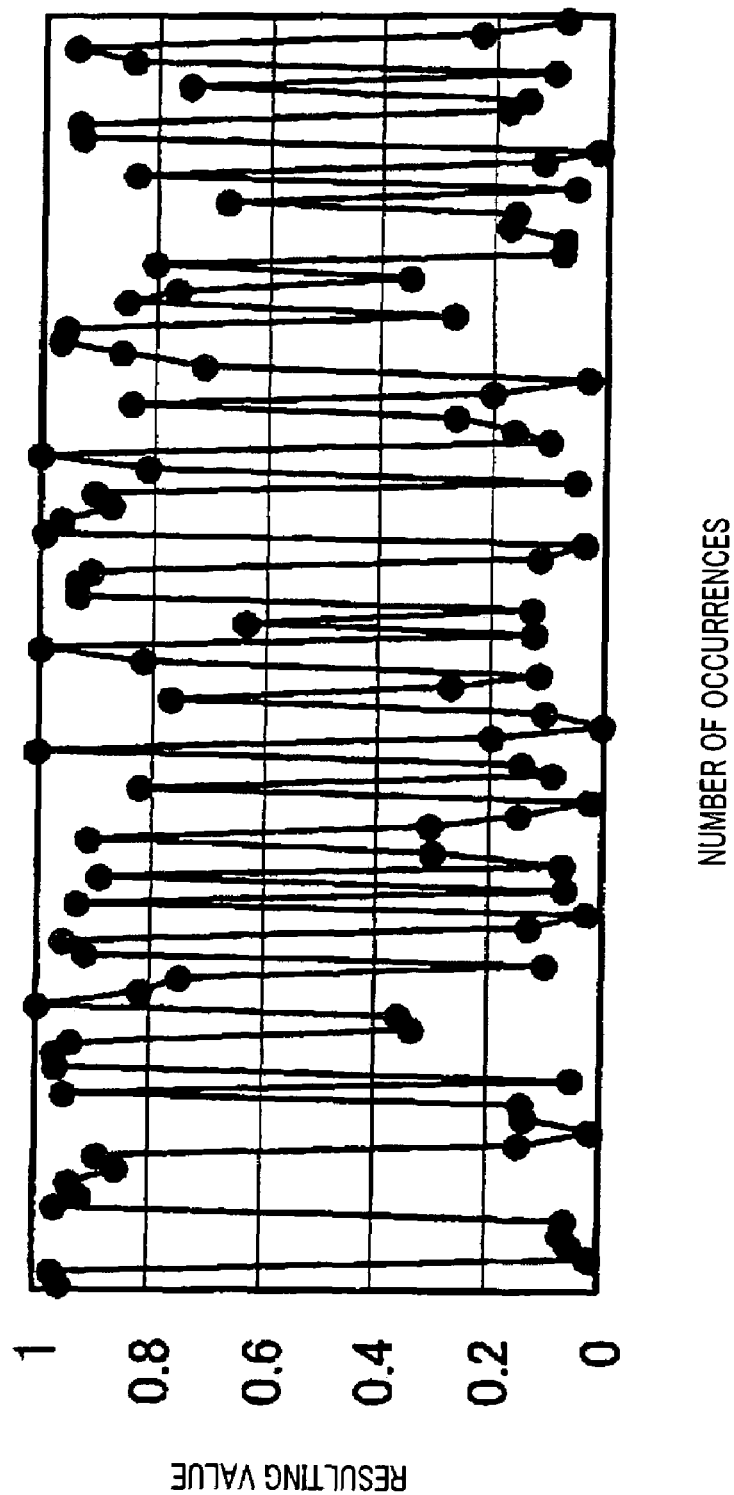
FIG. 9 is a graph showing a signal generation state of a control random signal generation function in embodiment 1 of the present invention.

FIG. 8 plots the function expressed by the formula (9). FIG. 9 plots variations in value which occur when uniform random numbers are sequentially introduced into this function. As can be seen from FIG. 9, the value varies randomly.

Figure 10A:
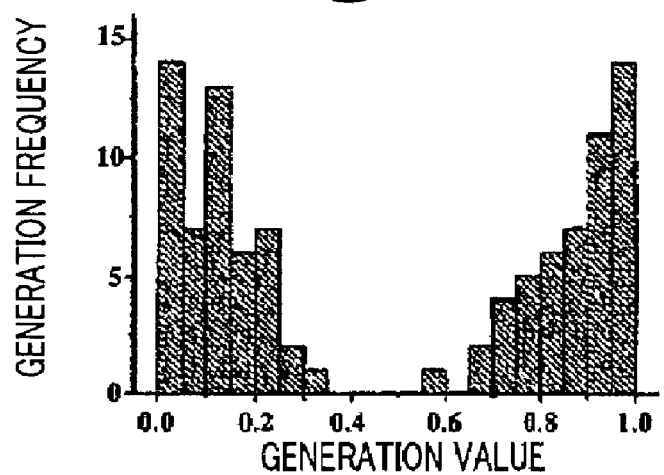
FIGS. 10(a) to 10(c) are each a graph showing a correlation between the times of control random signal generation and the frequency of control random signal generation.
Figure 10B:
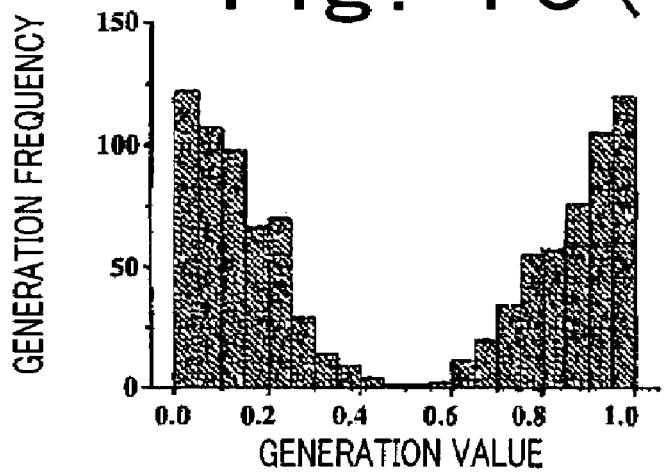
Figure 10C:
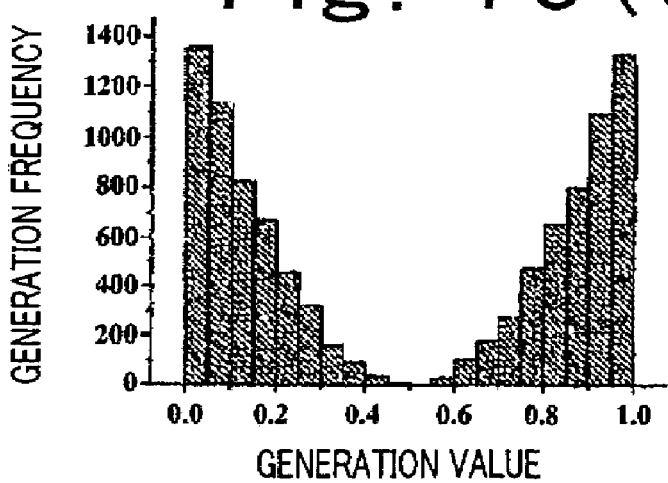

FIGS. 10(a) to 10(c) each show generation densities of generated values statistically interpreting random variations shown in FIG. 9. Note that FIGS. 10(a) to 10(c) shows cases where uniform random numbers R are introduced 100 times, 1,000 times and 10,000 times, respectively.

It is observed from FIGS. 10(a) to 10(c) that the graph gradually approximates to the quadratic function shown in FIG. 3 as the number of times of introduction increases. It is therefore understood that the formula (6) results in an intended distribution density.

As thus described, random numbers of a histogram having an intended distribution density can be obtained as long as the distribution density is an integrable function. Description is omitted of how to find a distribution function of which integral function is unknown by numerical calculations because it is not so difficult. Such a distribution function can simply be found by a similar operation of numerical calculations. One of the methods for such an operation is the rejection method for example. The rejection method includes randomly obtaining numbers satisfying the aforementioned conditions for a discontinuous function for example by numerical calculations and generating random numbers until the conditions are satisfied.

As described above, it is possible to control the histogram (density distribution) of noise generated. Further, if the density distribution of noise is known, it is possible to find a probability at which the pulse generation probability varies according to the magnitude of detected signal $V_S$.

By thus varying the density distribution of control random signal $V_C$ it becomes possible to control the pulse generation probability relative to the magnitude of detected signal $V_S$.

This principle enables not only finding of a pulse generation probability in proportion to detected signal $V_S$ but also flexible controls including: a control to lower the pulse generation probability sharply when control random signal $V_C$ is lower than a certain value of detected signal $V_S$; and a control to raise the pulse generation probability within a certain range of detected signal $V_S$.

Particularly after these operations, processing is performed only for counting of generated pulses and, hence, execution of parallel operations by LSI is easy.

It is needless to say that the control random signal so far described to be inputted to the stochastic pulse generator is not necessarily calculated by LSI.

Specifically, it is possible to store a progression calculated following the aforementioned procedure in memory in advance and subject the progression to digital-analog conversion (D/A conversion) before input. Since control random signals $V_C$ exhibit a stabilized histogram when the number of them is about 10,000 or more as apparent from FIGS. 10(a) to 10(c), it is sufficient to store 100,000 control random data for example. Even if 100,000 double precision data are to be stored, a necessary storage capacity is about 800 kByte (=8 Byte×100,000), which can easily be stored in recently-developed nonvolatile memory. Thus, this arrangement also allows desired controlled randomness to be exhibited.

The present embodiment 1 has an arrangement to input detected signal $V_S$ to one side of the comparator; however, it is needless to say that the pulse generation probability can be controlled similarly even though the detected signal $V_S$ has already contained a noise component as long as the profile of this noise component is known. Further, if control random signal $V_C$ is turned into an optimum distribution function tailored to this profile, the pulse generation probability thereof can be optimized as in the foregoing description.

Though the case where detected signal $V_S$ is constant (DC) has been described in embodiment 1 for easy description, it is needless to say that even if detected signal $V_S$ is a variable signal such as a periodic signal, pulses can be stochastically outputted relative to a signal value assumed at each time point. In this case, if the outputted pulses are subjected to Fourier transformation, a certain characteristic frequency can be identified.

As described above, the stochastic pulse generator according to the present invention is capable of controlling the frequency of stochastic pulse generation corresponding to the magnitude of detected signal $V_S$ by inputting feeble signal (detected signal $V_S$) having controlled distribution density and control random signal $V_C$ to one side and other side, respectively, of the comparator 3.

Since this stochastic pulse generator is capable of controlling random signals, even if the detected signal has already contained noise, the pulse generator can extract the periodic component of the original detected signal efficiently by using random signals having a profile canceling the distribution density of the noise.

Embodiment 2

Figure 11:
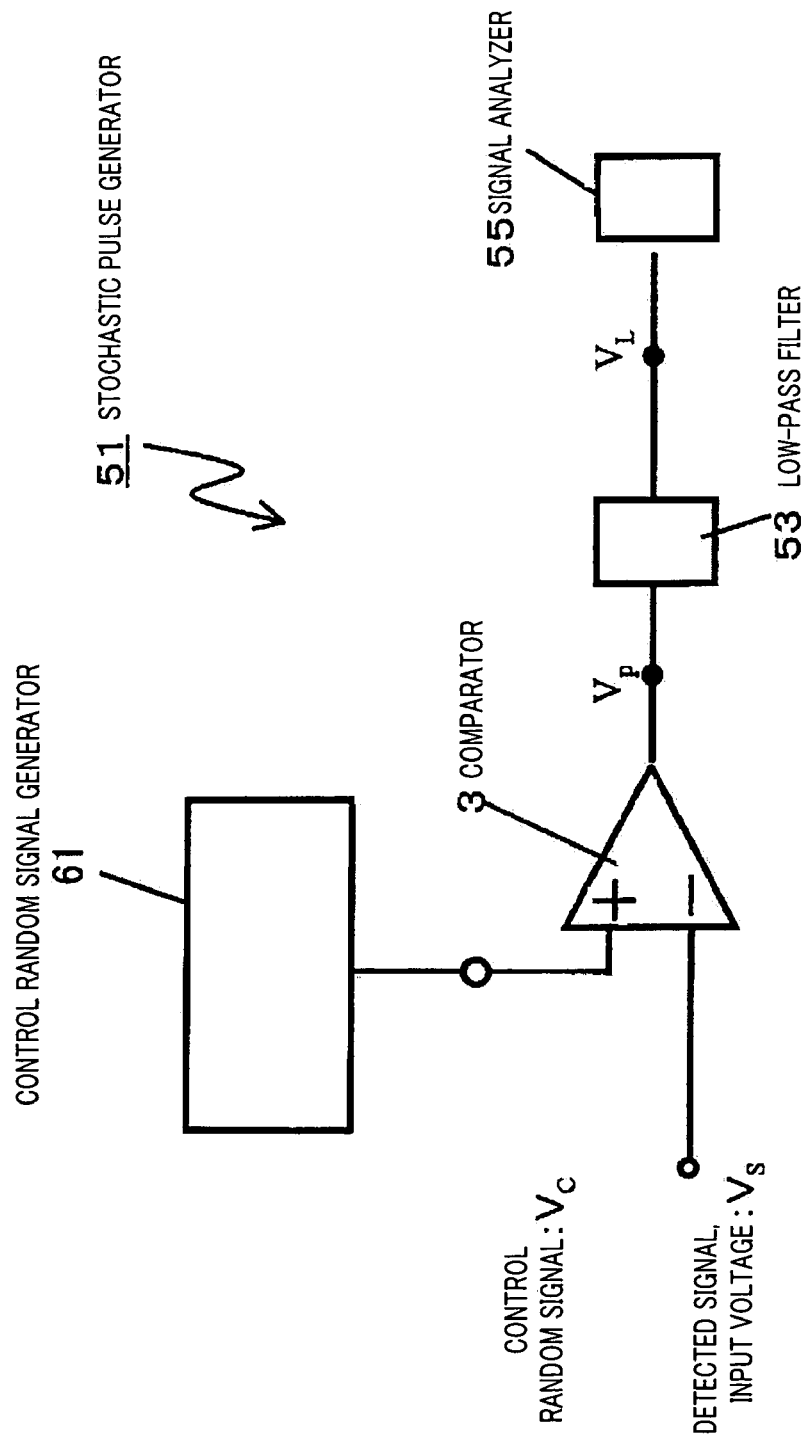
FIG. 11 is a circuit diagram showing the configuration of a stochastic pulse generator according to embodiment 2 of the present invention.

FIG. 11 is a circuit diagram showing the configuration of stochastic pulse generator 51 according to embodiment 2 of the present invention. Like reference characters are used to designate like elements throughout FIGS. 1 and 11 for omission of description thereof.

In the stochastic pulse generator 51 of FIG. 11 according to this embodiment, the output of comparator 3 is inputted to a low-pass filter 53, the output of which in turn is inputted to signal analyzer 55. The low-pass filter 53 has the function of allowing a frequency lower than a predetermined frequency to pass therethrough. The signal analyzer 55 analyzes signals outputted from the low-pass filter 53 by performing frequency analysis such as Fourier transformation for example.

Hereinafter, description will be made of the operation of the stochastic pulse generator of the configuration shown in FIG. 11 according to embodiment 2.

The stochastic pulse generator of this embodiment 2 is different from the stochastic pulse generator of embodiment 1 and is characterized in that the output of the comparator 3 is further inputted to the low-pass filter 53. In the following description, $V_P$ designates the output of the comparator 3 and $V_L$ designates the voltage resulting from passage of the output $V_P$ through the low-pass filter 53.

FIGS. 12(a) to 12(e) are each a graph plotting the voltage which results at each of different portions of the stochastic pulse generator of FIG. 11 when random numbers having a uniform distribution density are inputted as the control random signal.

Figure 12A:
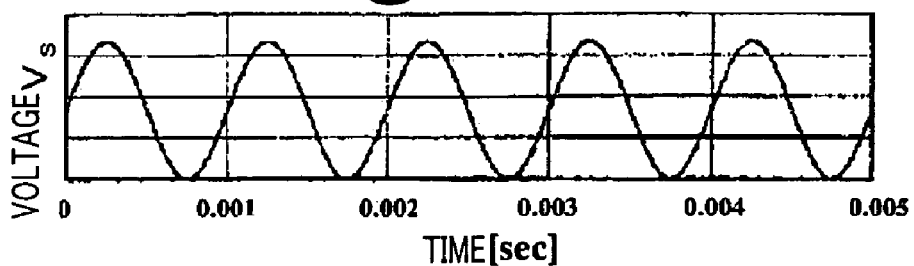
FIG. 12 includes graphs respectively plotting signal voltage waveforms at different parts of the stochastic pulse generator shown in FIG. 11.
Figure 12B:
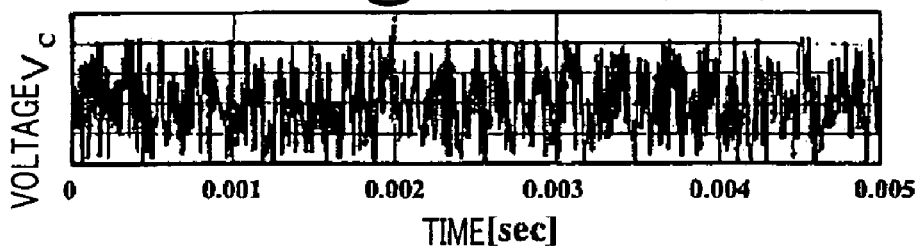
Figure 12C:
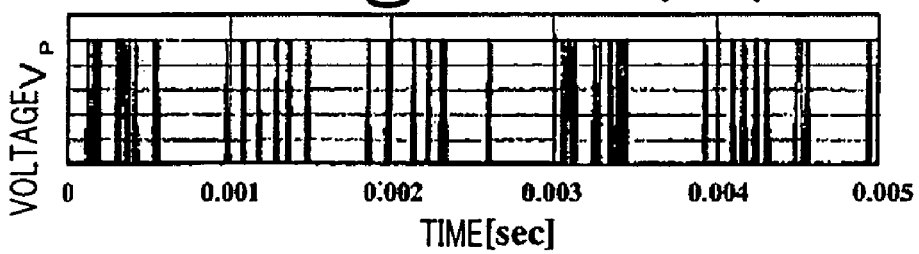

FIG. 12(a) shows the waveform of detected signal $V_S$, which is a sine wave of 1 kHz in this embodiment. FIG. 12(b) shows the waveform of control random signal $V_C$, which is controlled to have a uniform histogram of amplitude not shown. FIG. 12(c) shows the waveform of output voltage $V_P$ of the comparator 3. The output voltage $V_P$ generates pulses each having a very short duration as shown in the figure as a result of comparison between sine wave detected signal $V_S$ and control random signal $V_C$.

While the case where the detected signal is constant has been described in embodiment 1, as seen from FIG. 12(c), the frequency of pulse generation varies as the value of detected signal $V_S$ varies up and down.

Figure 12D:
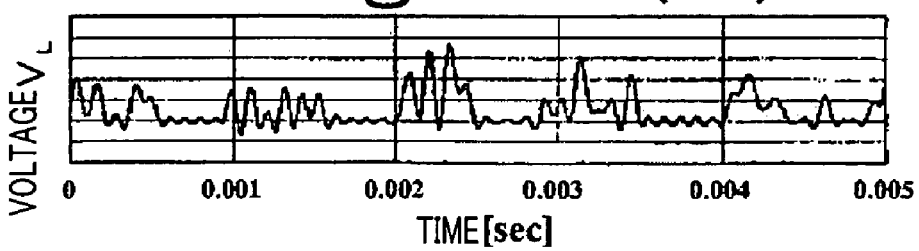
Figure 12E:
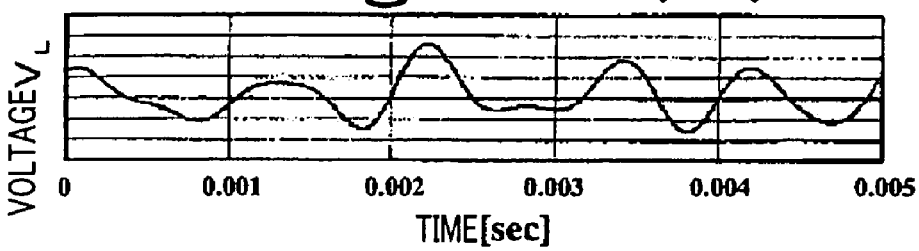
Figure 13:
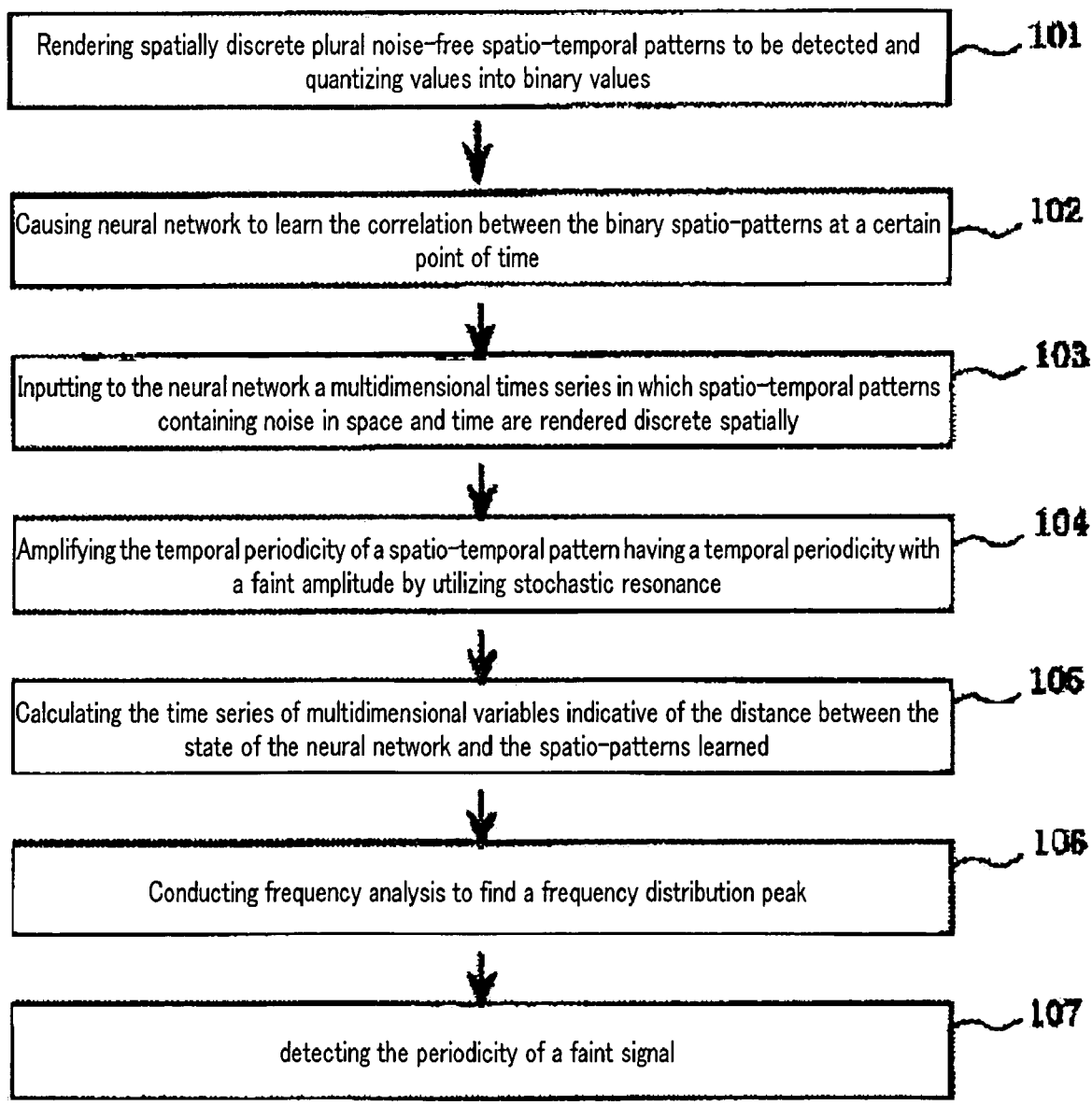
FIG. 13 is a flowchart of an example of a processing method using stochastic pulses according to the first conventional art.

FIGS. 12(d) and 12(e) each show the waveform of voltage $V_L$ resulting from filtering of the pulsed output by the low-pass filter 53. FIG. 12(d) is directed to the case where signals lower than 10 kHz are allowed to pass through the filter 53, while FIG. 12(e) directed to the case where signals lower than 2 kHz are allowed to pass through the filter 53. Note that there is a slight difference in tendency among FIGS. 12(b) to 12(e) because signals in these figures are not obtained at the same time for convenience in obtaining signals.

As can be seen from FIG. 12(e) in particular, an output waveform that is very similar to the characteristic of the feeble original signal can be obtained by blocking frequencies that are higher than but generally close to the characteristic frequency of the original detected signal.

If this waveform is subjected to frequency analysis based on, for example, Fourier transformation by the signal analyzer 55, 1 kHz which is the characteristic frequency of the detected signal can be observed very clearly.

Unlike embodiment 1, embodiment 2 does not have edge detector 7 inserted downstream of the comparator 3. However, it is needless to say that the stochastic pulse generator of embodiment 2 will have essentially the same function even if the edge detector 3 is included. A multiplicity of short-duration pulses are generated by varying control random signal $V_C$ very rapidly relative to the frequency of detected signal $V_S$ as shown in FIG. 12(c). Since any one of such pulses is blunted at the low-pass filter, the useful capability of accurate counting by the edge detector 7 used in embodiment 1 cannot be expected to work well in embodiment 2.

As described above, the stochastic pulse generator according to embodiment 2 blocks frequencies of the pulsed output from the comparator 3 that are higher than the characteristic frequency of the detected signal to obtain the characteristic waveform of the original detected signal, thereby facilitating the signal analysis.

It has been found that the pulse generation probability can be statistically controlled if the density distribution of control random signal $V_C$ in particular is controlled. Further, as demonstrated in the foregoing description, it is possible to calculate the pulse generation probability from the density distribution of control random signal $V_C$ as well as to obtain a desired density distribution of control random signal $V_C$.

According to the principle thus described, embodiment 1 is capable of providing a stochastic pulse generator which can control the detection condition (pulse generation probability) of detected signal $V_S$ by the use of control random signal $V_C$ having a specific density distribution, as well as a driving method thereof. Even if detected signal $V_S$ further contains a noise component, the use of control random signal $V_C$ canceling the profile of the noise component makes it possible to extract the signal component of the detected signal $V_S$ efficiently.

The stochastic pulse generator according to embodiment 2 passes the output of the comparator 3 through the low-pass filter 53 to render the pulses blunt and hence is capable of detecting a characteristic frequency component of the detected signal more easily.

Embodiment 3

Figure 14:
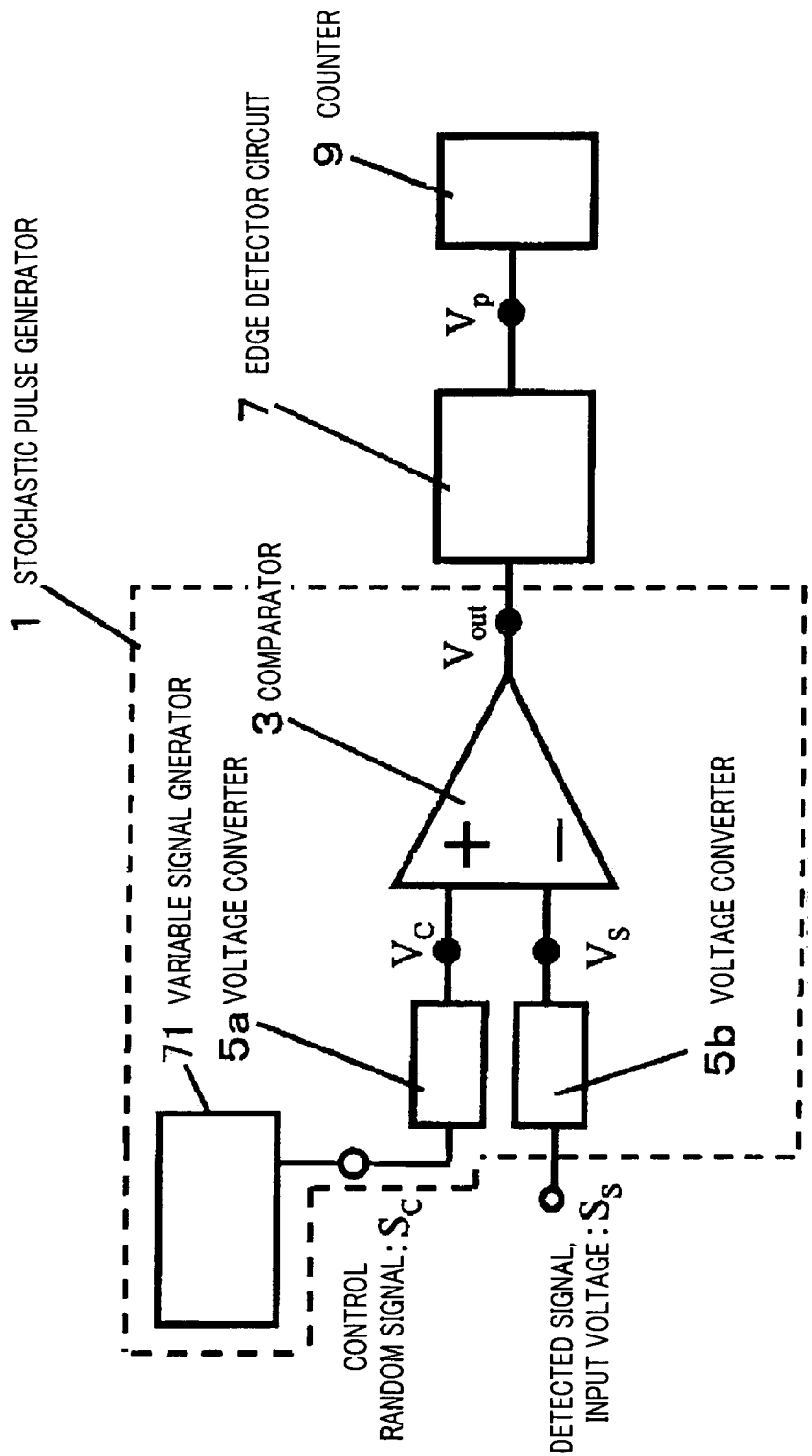
FIG. 14 is a circuit diagram showing the configuration of a stochastic pulse generator according to embodiment 3 of the present invention.

FIG. 14 is a circuit diagram showing an example of the configuration of a stochastic pulse generator according to embodiment 3 of the present invention. In FIG. 14, stochastic pulse generator 1 includes a variable signal generator 71 operative to generate a variable signal which is a kind of the control random signal used in embodiment 1, voltage converters 5a and 5b operative to convert variable signal $S_S$ outputted from the variable signal generator 71 and a detected signal (hereinafter will be referred to as input signal) $S_C$ to variable voltage $V_C$ and input voltage $V_S$, respectively, using predetermined formulae and output the variable voltage $V_C$ and input voltage $V_S$, and comparator 3 operative to compare the voltage signals outputted from respective of the voltage converters 5a and 5b and output voltage $V_P$ of a pulse shape. This embodiment further includes edge detector 7 operative to detect the leading edge of the pulse shape of the output $V_P$ of the comparator 3 and output pulses $V_P$ of equal width, and counter 9 operative to count the number of the pulses $V_P$ outputted from the edge detector 7 by detecting, for example, the leading edges of these pulses $V_P$.

The stochastic pulse generator 1 basically comprises the comparator 3, but is provided with the voltage converters 5a and 5b for the reason to be described later.

Since the comparator 3, edge detector 7 and counter 9 each have the same configuration as the corresponding one used in embodiment 1 and operate in the same manner as in embodiment 1, description thereof will be omitted.

Figure 15:
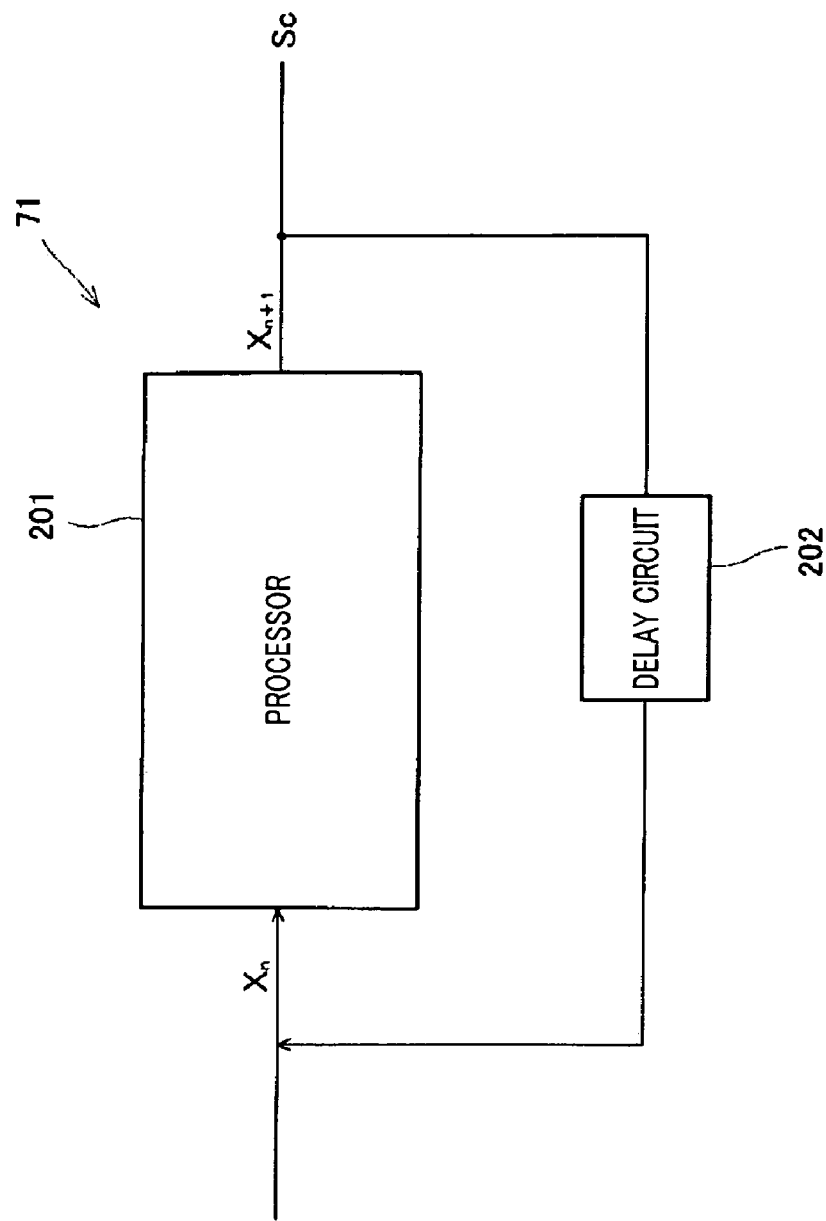
FIG. 15 is a circuit diagram showing the configuration of a variable signal generator of the stochastic pulse generator shown in FIG. 14.

As shown in FIG. 15, the variable signal generator 71, which is a kind of control random signal generator 61 used in embodiment 1, has a processor 201 operative to execute an operation based on a predetermined formula represented as the function: $X_{n+1}=f(X_n)$ for a variable $X_n$ inputted and output the resulting $X_{n+1}$, and a delay circuit 202 operative to delay $X_{n+1}$ outputted from the processor 201 by a predetermined time and input the delayed $X_{n+1}$ to the processor 201. Thus, this configuration externally outputs a sequence of outputs $X_{n+1}$ from the processor 201 as variable signal $S_C$. The variable signal $S_C$ will be described in detail later.

In the stochastic pulse generator 1 according to this embodiment, the plus input terminal of the comparator 3 receives, as an input, the variable signal $S_C$ or the variable voltage $V_C$ converted by the voltage converter 5a, while the minus input terminal of the comparator 3 receives, as an input, the input signal Ss to be expressed as stochastic pulses or the input voltage $V_S$ converted by the voltage converter 5b. However, it is needless to say that a similar operation will result even in a reverse arrangement.

Hereinafter, description will be made of the operation of the stochastic pulse generator 1 of the configuration shown in FIG. 14.

When the variable voltage $V_C$ and the input voltage $V_S$ are inputted to the comparator 3 in the configuration shown in FIG. 14, pulses corresponding to input voltage $V_S$ in a time domain in which the variable voltage $V_C$ is inputted are outputted randomly, with the number of such pulses thus outputted corresponding to the magnitude of input voltage $V_S$. This operation is the same as in embodiment 1.

The following description is directed to the fact that the number of pulses counted by the counter 9 is stochastically indicative of the magnitude of input voltage $V_S$.

Figure 16:
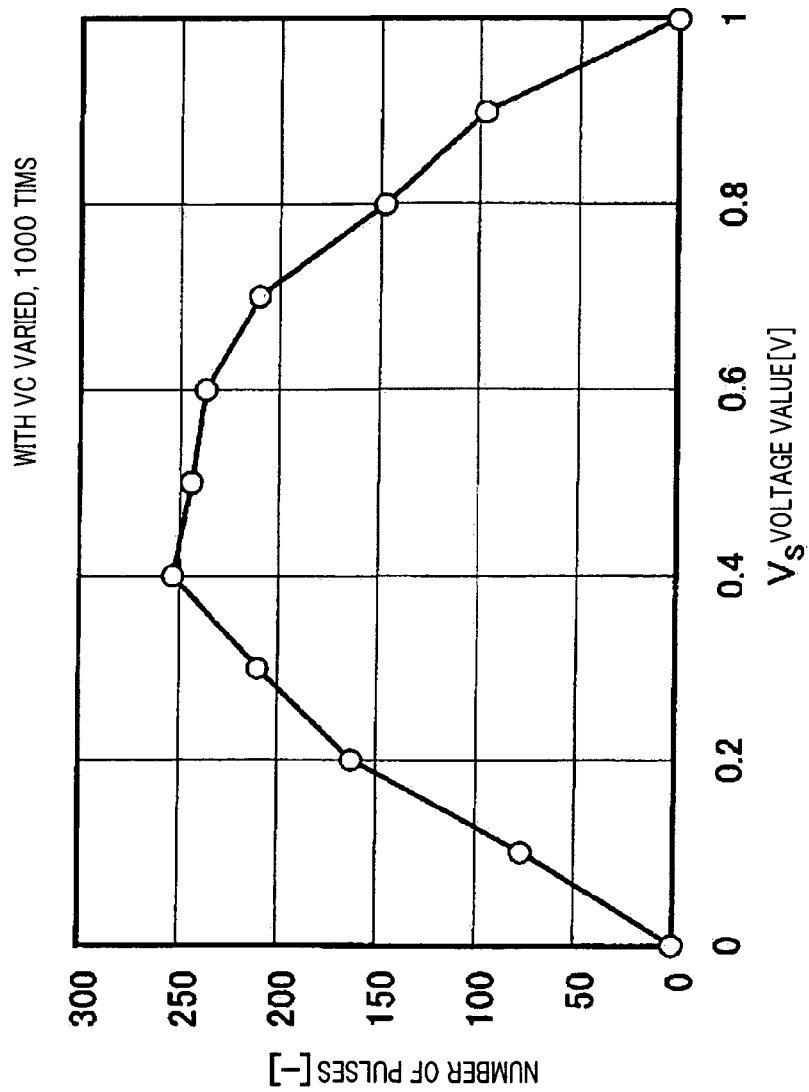
FIG. 16 is a graph showing pulse generation state of the stochastic pulse generator shown in FIG. 14.

FIG. 16 plots the number of pulses generated when the variable voltage $V_C$ is varied 1,000 times with the input voltage $V_S$ fixed to a value (within the range from 0 to 1 [V]) on the horizontal axis. In this case the variable voltage $V_C$ varies according to uniform random numbers and the range of its variation is set to within the range from 0 to 1 [V].

As shown in FIG. 16, there is obtained the characteristic that the number of pulses varies like a quadratic function describing an upwardly projecting curve. Here, the conversion of input signal $S_S$ to input voltage $V_S$ by the voltage converter 5b of FIG. 14 is performed using, for example, the following formula (10):

$$V_S=0.4\times(S_S-S_{Smin})/(S_{Smax}-S_{Smin}) \quad (10)$$

wherein $S_{Smax}$ and $S_{Smin}$ represent a maximum value and a minimum value, respectively, of input signal $S_S$.

The variable voltage $V_C$ is a voltage converted with uniform random numbers within the range from 0 to 1 by a factor of 1.

Then, input voltage $V_S$ assumes a voltage from 0 to 0.4 [V]. Thus, an increasing number of pulses are counted as the magnitude of original input signal $S_S$ increases, as shown in FIG. 16.

That is, the stochastic pulse generator of the present invention can have the capability of converting the magnitude of input signal $S_S$ to a number of pulses by means of the operation thus described. As can also be seen from FIG. 5 (embodiment 1), a pulses count becomes more stochastic as the number of variations in variable signal decreases. Therefore, decreasing the number of variations in variable signal will shorten the time required for a number of pulses to be obtained, but will enlarge the error. On the other hand, increasing the number of variations will reduce the error.

Considerations will be given to the pulse generation probability relative to input voltage $V_S$ in embodiment 3.

Figure 17:
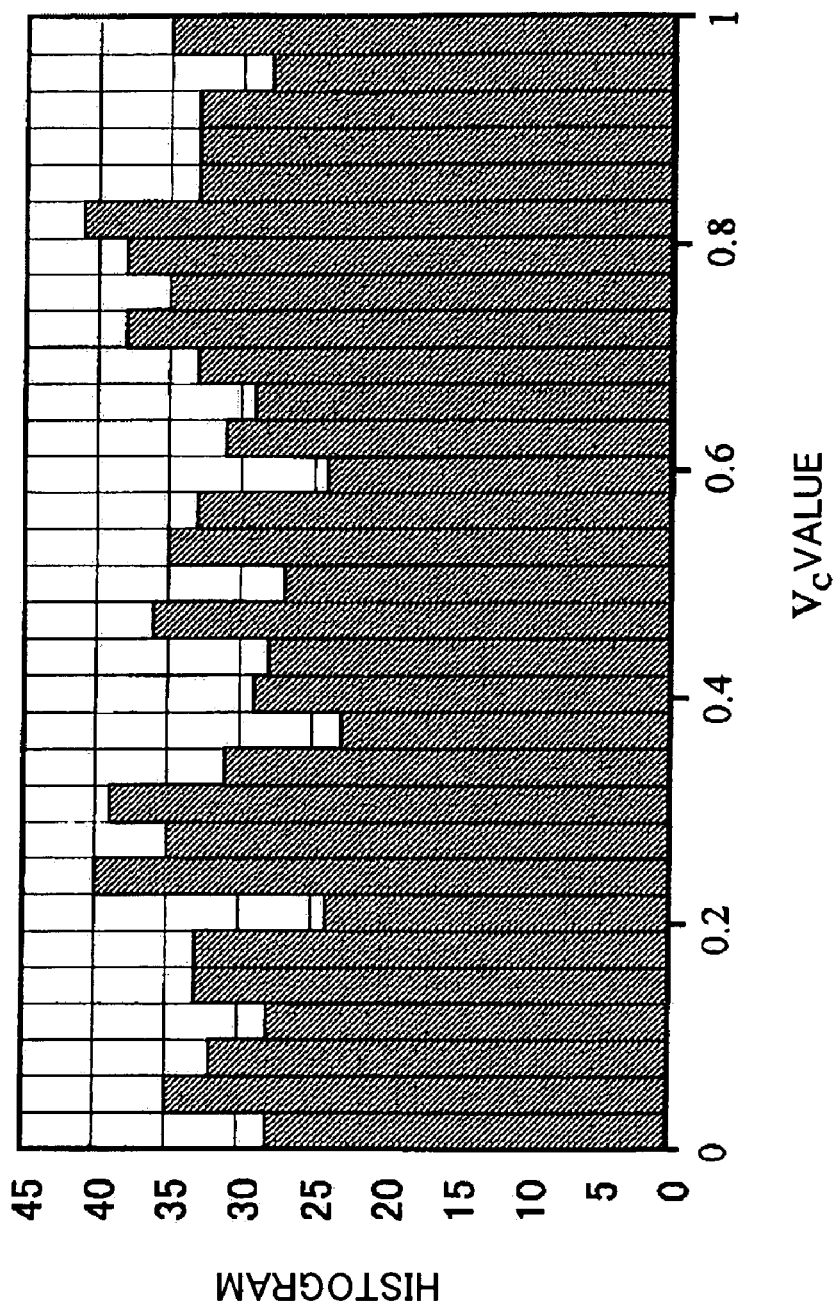
FIG. 17 is a graph showing a characteristic of variable signal in embodiment 3 of the present invention.

FIG. 17 shows a histogram of the number of times of uniform random number generation in embodiment 3. As seen from FIG. 17, random numbers have a relatively flat and uniform distribution.

Figure 18:
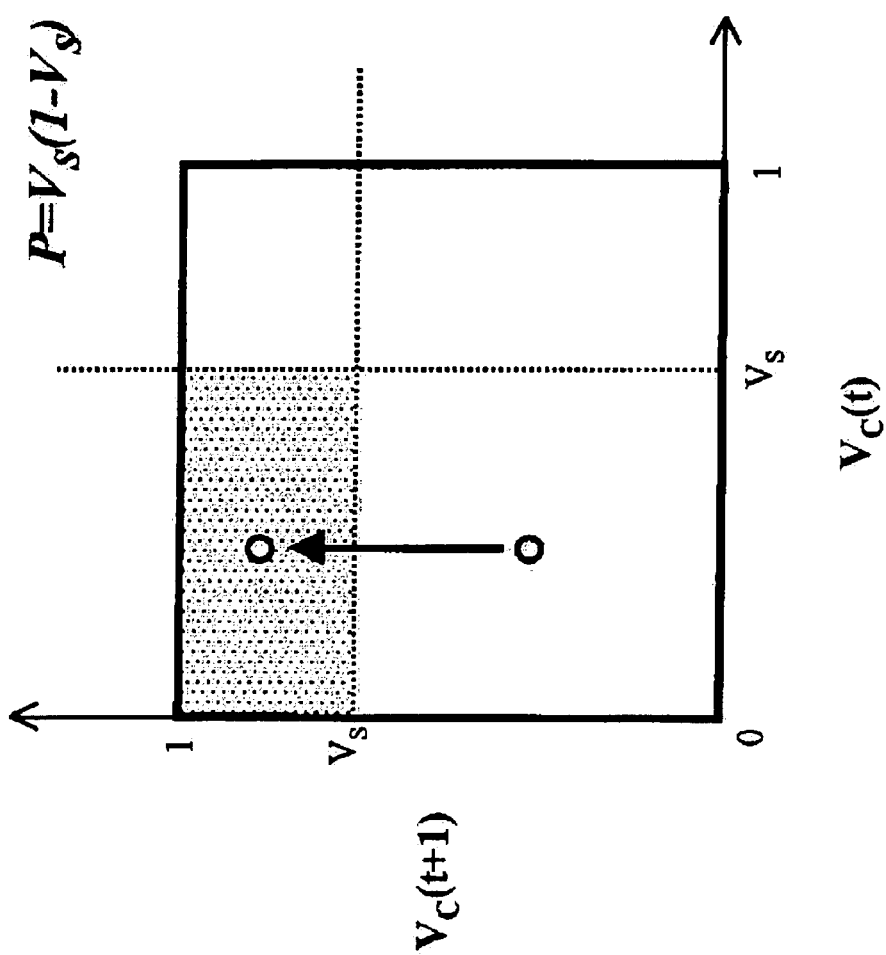
FIG. 18 is a schematic diagram illustrating the principle of a pulse generation probability calculation executed by the stochastic pulse generator shown in FIG. 14.

Here, considerations are given again to the pulse generation conditions for the stochastic pulse generator of the present invention with reference to FIG. 18.

As described above, pulse generation occurs under the conditions where $V_C$ is smaller than $V_S$ and the next $V_C$ is larger than $V_S$ (in the present arrangement). Assuming that $V_C$ on a certain occurrence is $V_C(t)$ and $V_C$ on the next occurrence is $V_C(t+1)$, the hatched area of the mapped space in FIG. 18 represents the pulse generation probability.

Since $V_C$ is uniform random numbers here, the probability of occurrence of a certain number is uniform in the range from 0 to 1. Therefore, the probability of the occurrence of $V_C(t)$ in the range from 0 to $V_S$ is $V_S$. Further, the probability of the occurrence of $V_C(t+1)$ in the range from $V_S$ to 1 is $(1-V_S)$ and, as a result, the pulse generation probability P of the stochastic pulse generator of embodiment 1 is given by the following formula (11):

$$P=V_S(1-V_S) \quad (11).$$

As understood from the above formula, the pulse generation probability of the stochastic pulse generator of embodiment 3 is a quadratic function of $V_S$ and, hence, the number of generated pulses shown in FIG. 16 approximates to the quadratic function of the formula (11) by introduction of $V_C$ 1,000 times.

As described above, the stochastic pulse generator 1 according to this embodiment, despite its simple circuit configuration, is capable of obtaining the magnitude of an input voltage in the form of a number of stochastic pulses by adjusting the variable voltage and the input voltage to respective optimum voltage values, inputting these values to the comparator to cause pulse generation to occur, and counting the generated pulses.

By virtue of this function the stochastic pulse generator 1 is capable of expressing the magnitude of an input voltage in the form of a number of stochastic pulses directly without converting an analog signal to a digital signal.

Embodiment 4

A stochastic pulse generator according to embodiment 4 of the present invention controls the variable signal to have a characteristic that is different from that of the stochastic pulse generator of embodiment 3, thereby obtaining another capability. Hereinafter, description will be made of this feature.

The stochastic pulse generator according to this embodiment 4 is characterized by the use of chaos of a tent map. Specifically, the processor 201 of the variable signal generator 71 shown in FIG. 15 performs an operation of a tent map to be described below and outputs variable signal $S_S$ comprising chaos of the tent map.

First, description will be made of chaos of a tent map with reference to FIG. 19.

Figure 19:
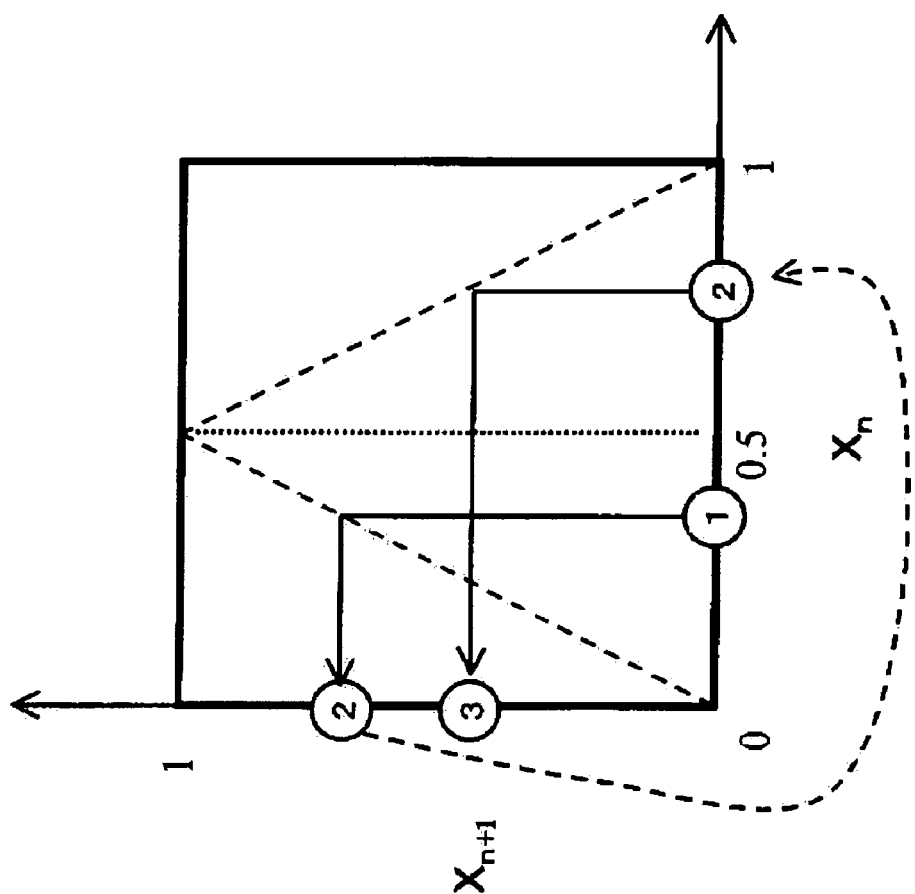
FIG. 19 is a schematic diagram illustrating the principle of variable signal generation by a stochastic pulse generator according to embodiment 4 of the present invention.

Any desired initial value $X_1$ is first selected in FIG. 19, and then a second value is determined according to the line using the following formulae (12) and (13) (mapping):

$$X_2=2X_1(X_1\leq 0.5) \quad (12)$$

$$X_2=2(1-X_1)(X_1>0.5) \quad (13)$$

Subsequently, from the value of $X_2$ thus obtained, $X_3$ is found using again the formulae (12) and (13). Tent map chaos can be obtained by such a simple mapping operation. However, a progression obtained in this manner is known to exhibit very complicated behavior in a long term.

The pulse generation probability that is given when such tent map chaos is used as the variable signal $S_S$ will be examined using FIG. 20.

Like uniform random numbers in embodiment 3, tent map chaos has been mathematically demonstrated to have a constant histogram. Therefore, the following analysis holds.

For the same reason as stated in embodiment 1 the hatched areas in respective of FIGS. 20(*a*) and 20(*b*) each determine the pulse generation probability in each case.

The difference from embodiment 3 resides in that since the value on the second occurrence is determined from a map in this embodiment, each of the hatched areas in FIG. 20 does not represent the pulse generation probability, but pulse generation is possible only in the ranges indicated by thick lines in FIG. 20. That is, each of widths P indicated by respective arrows represents the pulse generation probability.

As shown in FIG. 20, the following two different calculation formulae are used to find width P depending on whether $V_S$ is larger than or smaller than ⅔.

$$P=V_S/2(V_S\leq 2/3) \quad (14)$$

$$P=1-V_S(V_S\geq 2/3) \quad (15)$$

Figure 21:
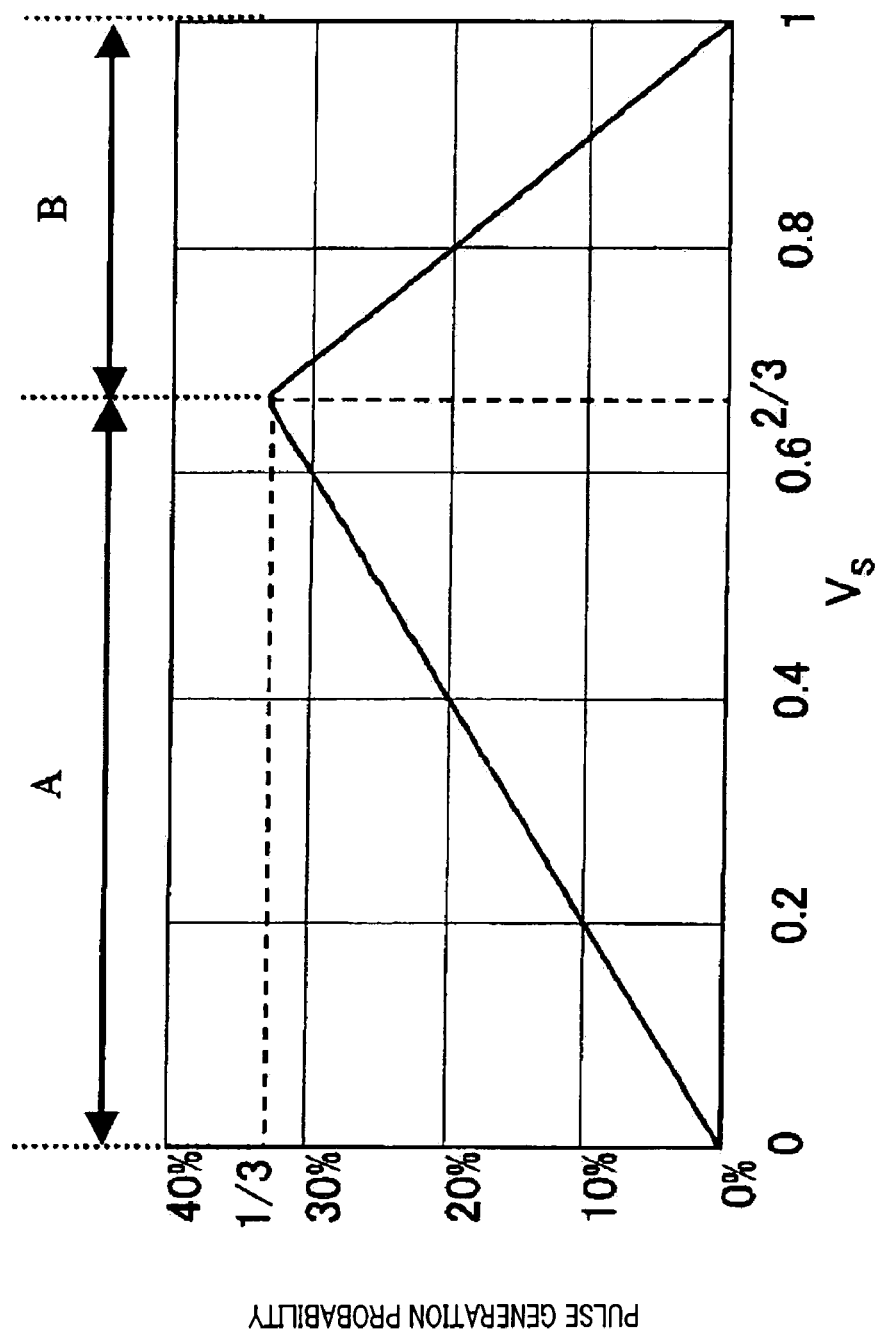
FIG. 21 is a graph showing an exact solution to the pulse generation probability of the stochastic pulse generator according to embodiment 4 of the present invention.

The outcome of calculation of the pulse generation probability by these formulae (14) and (15) is shown in FIG. 21.

If the voltage converter 5*a* shown in FIG. 14 is controlled so that $V_S$ may range from 0 to ⅔ (range A in the figure) for example as in embodiment 3, the stochastic pulse generator 1 of this embodiment 4 can obtain a linear pulse generation characteristic relative to the value of input signal $S_S$ as an exact solution and the pulse generation probability is seen to fall within the range from 0% to 33%.

As can be understood from the above description, the stochastic pulse generator of this embodiment 4 is capable of obtaining a number of pulses which is linear relative to input signal $S_S$ as an exact solution (if the variable signal is varied numerous times).

That is, the stochastic pulse generator is capable of turning the analog value of an input signal into a linear pulse generation probability. Thus, it becomes possible to calculate an absolute difference between pulse generation probabilities relative to different input signals simply as a difference in the number of pulses.

Though description has been directed to the case where range A in FIG. 21 is used in embodiment 4, it is needless to say that the use of range B will result in a similar effect.

Embodiment 5

A stochastic pulse generator according to embodiment 5 of the present invention is characterized by the use of a progression called "Bernoulli shift" as the variable signal, unlike the stochastic pulse generator of embodiment 4. Specifically, the processor 201 of the variable signal generator 71 shown in FIG. 15 executes an operation using a progression called "Bernoulli shift" to output variable signal $S_S$.

Description will be made of a Bernoulli shift map with reference to FIG. 22.

Figure 22:
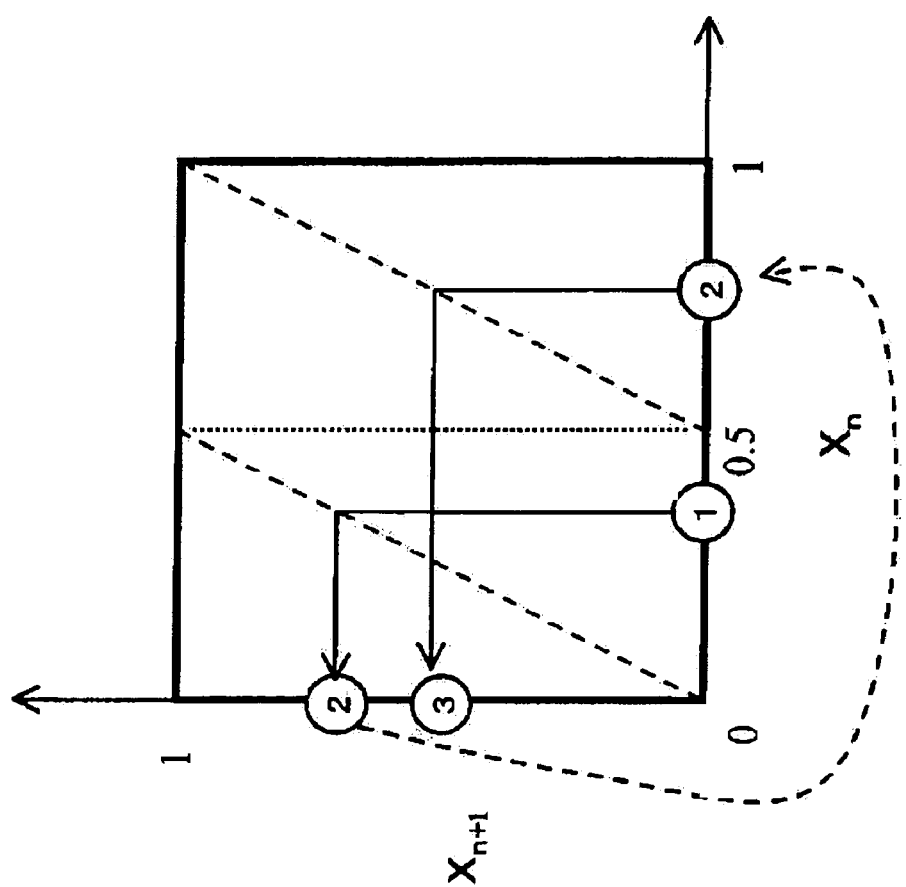
FIG. 22 is a schematic diagram illustrating the principle of variable signal generation by a stochastic pulse generator according to embodiment 5 of the present invention.

Any desired initial value $X_1$ is first selected in FIG. 22, and then a second value is determined according to the line using the following formulae (16) and (17):

$$X_2=2X_1(X_1\leq 0.5) \quad (16)$$

$$X_2=2X_1-1(X_1\geq 0.5) \quad (17)$$

Subsequently, from the value of $X_2$ thus obtained, $X_3$ is found using again the formulae (16) and (17). Such a simple mapping operation is repeated as in embodiment 4. The Bernoulli shift map also generates a progression of a uniform histogram.

Thus, as in embodiment 4, the pulse generation probability of the stochastic pulse generator according to this embodiment 5 can be obtained as shown in FIGS. 23(*a*) and 23(*b*). The ranges indicated by the thick lines on the maps in FIGS. 23(*a*) and 23(*b*) represent pulse generation probabilities and are calculated by the formulae:

$$P=V_S/2(V_S\leq 0.5) \quad (18)$$

$$P=(1-V_S)/2(V_S\geq 0.5) \quad (19)$$

Figure 24:
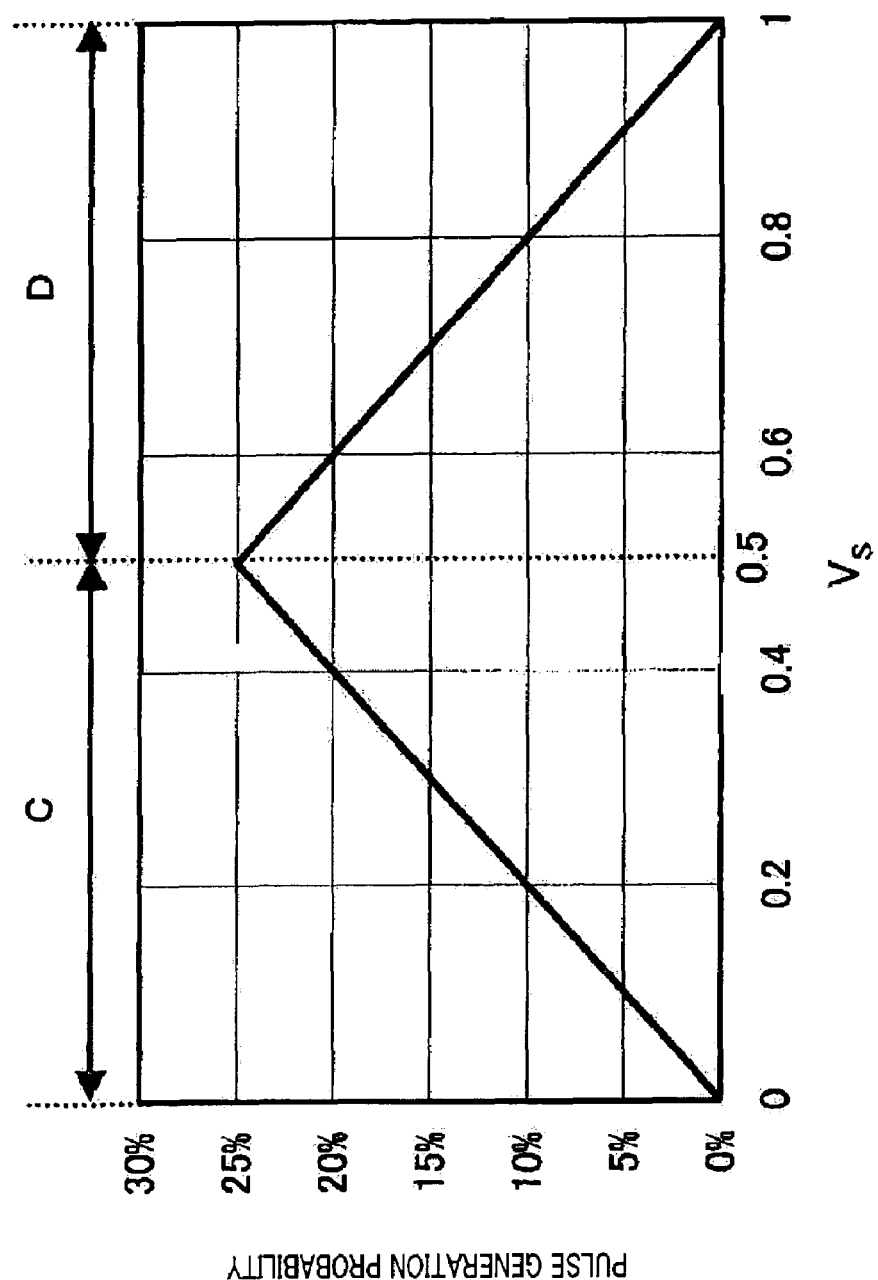
FIG. 24 is a graph showing an exact solution to the pulse generation probability of the stochastic pulse generator according to embodiment 5 of the present invention.

The outcome of calculation of the pulse generation probability by these formulae (18) and (19) is shown in FIG. 24. Like embodiment 4, this embodiment 5 can obtain a linear pulse generation probability characteristic that has a peak when $V_S=0.5$.

If the voltage converter 5*a* shown in FIG. 14 is controlled so that input voltage $V_S$ may range from 0 to 0.5 (range C in the figure) for example, the stochastic pulse generator of this embodiment 5 can obtain a linear pulse generation characteristic relative to the value of input signal $S_S$ as an exact solution and the pulse generation probability is seen to fall within the range from 0% to 25%.

That is, the stochastic pulse generator of this embodiment 5 is also capable of turning the analog value of an input signal into a linear pulse generation probability.

It is needless to say that the use of range D will result in a similar effect.

In each of the foregoing embodiments 3 to 5, description has been made of the cases where pulse generation is caused to occur using uniform random numbers, a tent map or a Bernoulli shift map as the variable signal. As can be understood from the description of these embodiments, it is needless to say that the variable signal need not necessarily be obtained by calculation, but the use of, for example, an amplified noise signal results in a similar operation. Such a noise signal, in particular, is preferably has a known histogram. A noise signal having a stable histogram shape is more preferable in terms of easiness in determining calculations for voltage conversion to a signal voltage.

Embodiment 6

A stochastic pulse generator according to embodiment 6 is characterized by the use of a chopper type comparator as the comparator.

The chopper type comparator (hereinafter will be referred to as "$C_C$") is a circuit for use in analog-digital conversion or the like. Since $C_C$ is capable of canceling variations in transistor threshold, $C_C$ is a very useful circuit in CMOS in particular. In prospect of the incorporation of a stochastic pulse generator into a silicon semiconductor, the ability to form and drive a stochastic pulse generator with the use of $C_C$ is highly industrially effective.

Figure 25:
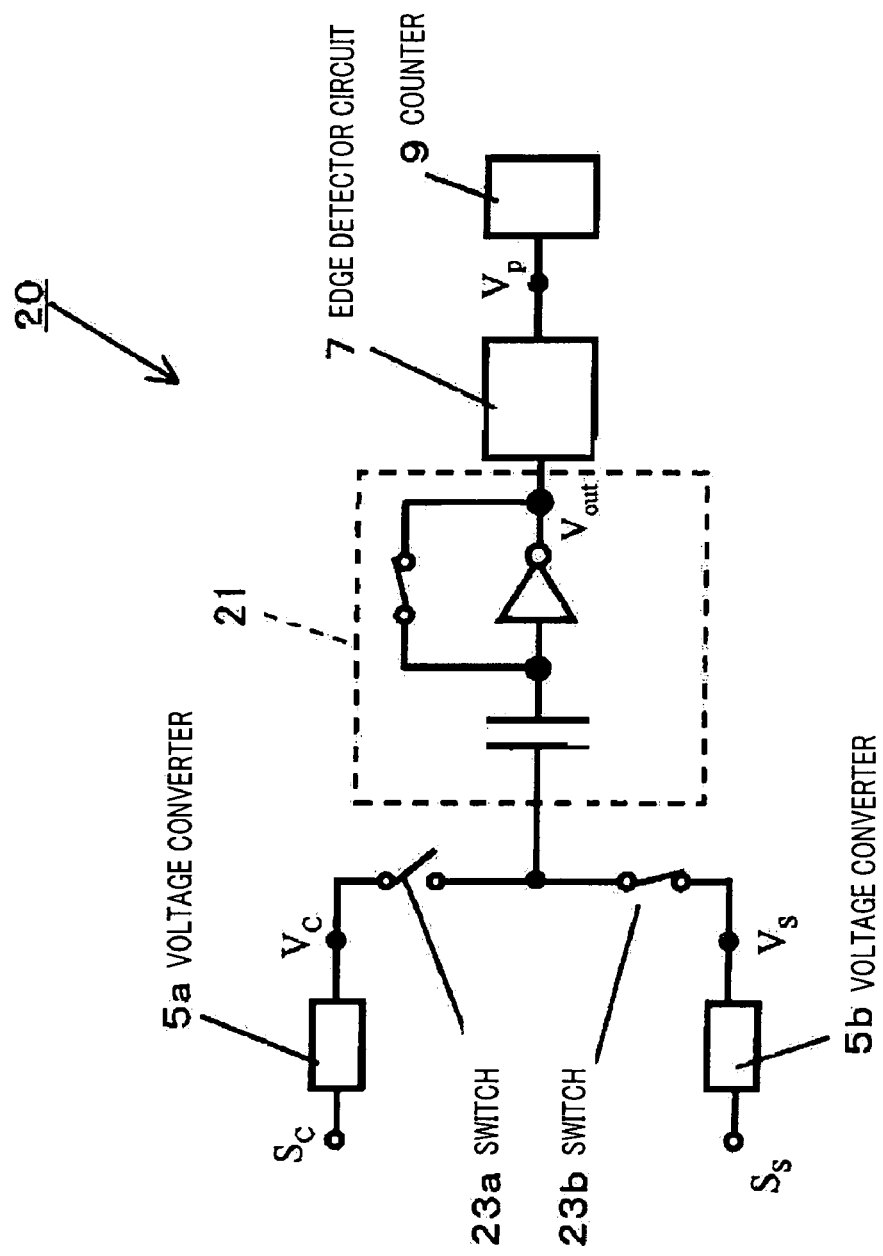
FIG. 25 is a circuit diagram showing the configuration of a stochastic pulse generator according to embodiment 6 of the present invention.

FIG. 25 is a circuit diagram showing the configuration of the stochastic pulse generator of embodiment 6. Like reference characters are used to designate like parts throughout FIGS. 14 and 25 for the purpose of omitting the description thereof. In FIG. 25, stochastic pulse generator 20 of this embodiment 6 has a comparator 21 including $C_C$ comprising a capacitor, an inverter and a switch (MOS transistor for example). Variable voltage $V_C$ and input voltage $V_S$ outputted from voltage converters 5a and 5b are inputted to the comparator 21 through switches 23a and 23b, respectively. The switches 23a and 23b each comprise a MOS transistor for example.

FIGS. 26(a) and 26(b) are diagrams illustrating the operation of $C_C$. In the operation, voltage $V_1$ is applied to $C_C$ with switch SW in a short-circuited state as shown in FIG. 26(a) and then switch SW is turned OFF, followed by application of $V_2$ as shown in FIG. 26(b). If $V_2$ is larger than $V_1$, the inverter performs inversion to output $V_{out}$ assuming Low. On the other hand, if $V_2$ is smaller than $V_1$, the inverter outputs $V_{out}$ assuming High. In this way, $C_C$ can compare voltages as to their respective magnitudes by turning switch SW ON/OFF to allow the voltages to be inputted sequentially.

In this example, $V_{out}$ assumes High first and then inverted to assume Low. This operation is not essential. If, for example, an additional inverter is provided at the output terminal, High and Low can be reversed.

FIG. 27 is a diagram illustrating the operation of the stochastic pulse generator according to this embodiment 6.

Figure 27A:
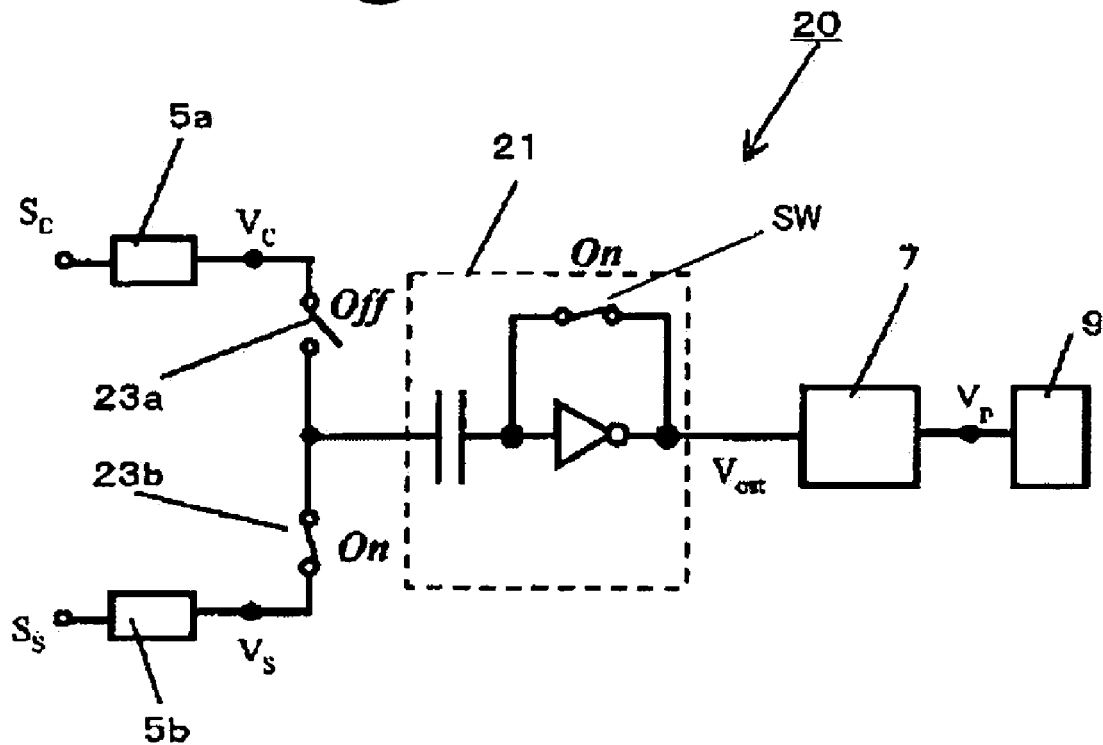
FIGS. 27(a) and 27(b) are circuit diagrams for illustrating the operation of the stochastic pulse generator according to embodiment 6 of the present invention.

As shown in FIG. 27(a), first, switch 23a and switch 23b in the stochastic pulse generator 20 are turned OFF and ON, respectively, while switch SW of the comparator 21 comprising $C_C$ is also turned ON. In response thereto, the voltage converter 5b converts input signal $S_S$ to input voltage $V_S$ based on the formulae described in embodiments 3 to 5, and the resulting input voltage $V_S$ is applied to the comparator 21 via switch 23b. Thereafter, the switch SW of the comparator 21 is turned OFF, so that $V_S$ is written to $C_C$.

Figure 27B:
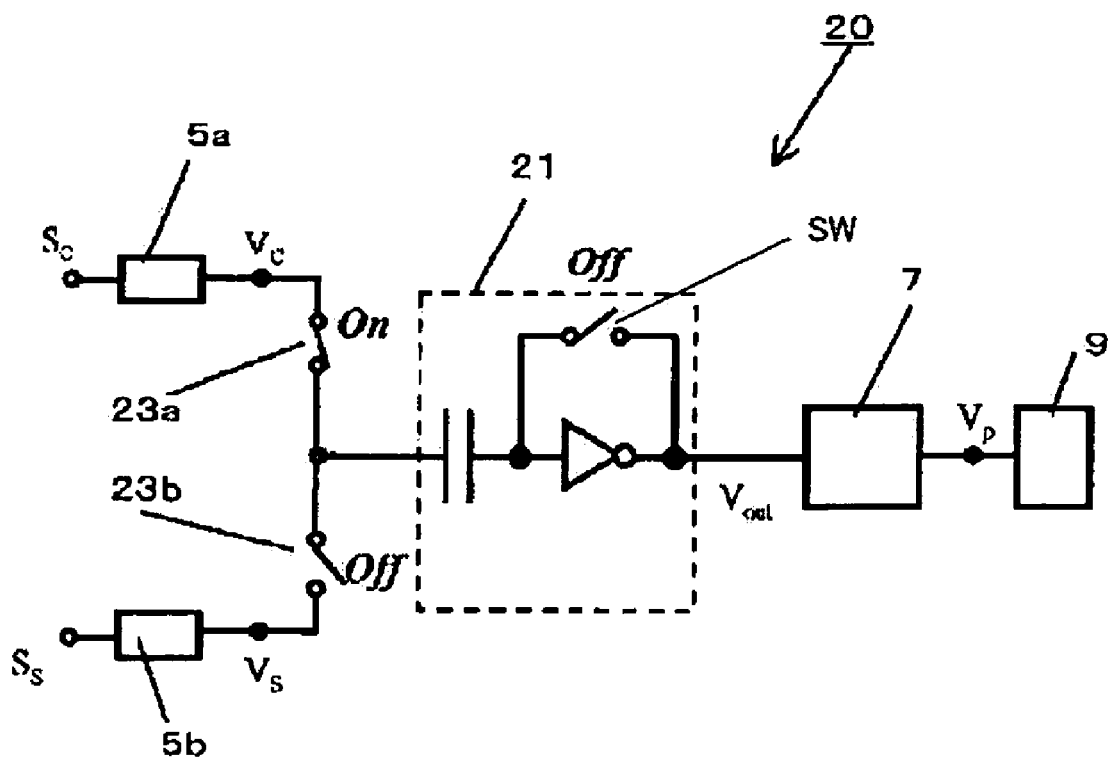

Subsequently, as shown in FIG. 27(b), the switch 23b and switch 23a are turned OFF and ON, respectively. In response, variable signal $S_C$ is converted to variable voltage $V_C$ by the process described in embodiments 3 to 5, and the resulting variable voltage $V_C$ is applied to the comparator 21 via switch 23a. The comparator 21, in turn, outputs High/Low signal $V_{out}$, which is then converted to pulses $V_P$ of equal width by edge detector circuit 7, and counter 9 counts these pulses.

Figure 28:
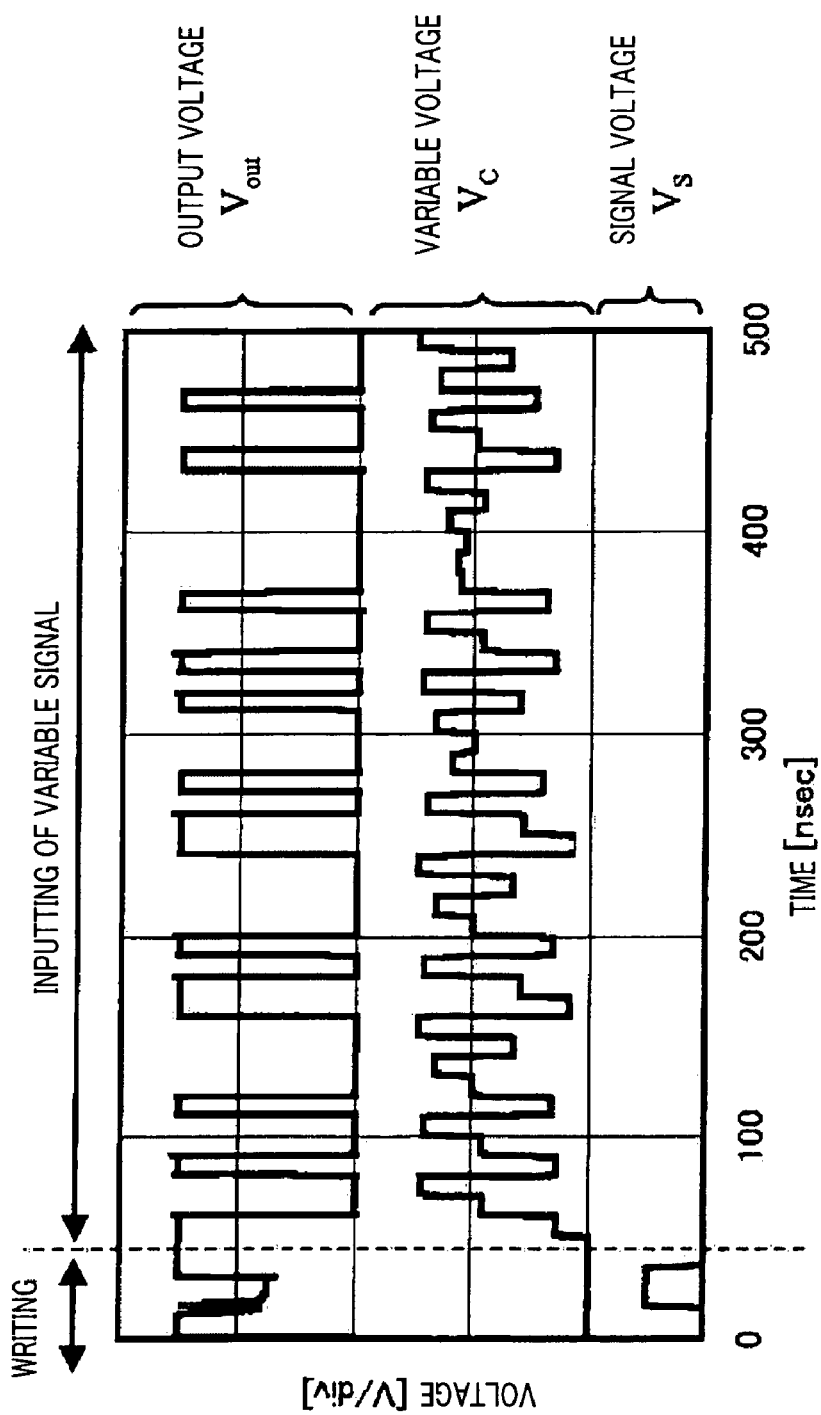
FIG. 28 is a schematic diagram showing an example of the operation of the stochastic pulse generator according to embodiment 6 of the present invention.

FIG. 28 is a graph showing an operating state of the stochastic pulse generator of this embodiment 6. In FIG. 28, the horizontal axis and the vertical axis represent time and a voltage of 1[V/div], respectively, and the graphs plot input voltage $V_S$, variable voltage $V_C$, and comparator output $V_{out}$ in the ascending order.

The switch SW of the comparator 21 opens and closes to write a signal voltage $V_S$ of 0.5 [V] during an initial period of 10 to 30 [nsec]. Thereafter, variable voltages $V_C$ are sequentially applied from a point of time at 50 [nsec].

In this example, voltages according to a progression generated by tent map chaos are applied.

Since the High/Low output of $C_C$ is inverted, the output $V_{out}$ assumes High when $V_C$ is smaller than $V_S$ which is written first. When $V_C$ lowers from a value higher than 0.5 [V] to a value lower than 0.5 [V] in FIG. 28, the output $V_{out}$ changes over to High. If the edge detection described in embodiment 3 is conducted thereafter, it is possible to detect the edge of $V_{out}$ assuming High as well as to obtain the number of pulses corresponding to the value of $V_S$, though detailed description of this operation is omitted here.

Since the stochastic pulse generator of this embodiment 6 is capable of performing successive comparing operations by means of comparator 21 by simply varying variable signal $S_C$ to one value after another in the state shown in FIG. 27(b) in particular, the value of input signal $S_S$ can be converted to a number of stochastic pulses by a very simple driving method. Specifically, if variable signal $S_C$ is generated according to the tent map chaos used in embodiment 4 for example, the number of pulses counted by the counter 9 linearly expresses the magnitude of the variable signal $S_C$ in the form of stochastic pulses.

Embodiment 7

A stochastic pulse generator according to embodiment 7 of the present invention is different from those of embodiments 3 to 6 in the manner of inputting variable signal $S_C$.

In the description of the stochastic pulse generator in each of embodiments 3 to 6, variable signal $S_C$ has been simply described to be uniform random numbers or a map progression and, hence, the value of variable signal $S_C$ is not mentioned specifically.

The stochastic pulse generator according to embodiment 7 is characterized in that the same progression is applied every time as variable signal $S_C$.

Such a progression can be obtained by storing generated uniform random numbers into a storage device and using the stored uniform random numbers from the initial number every time. In the case where a map such as a tent map or a Bernoulli shift map is used, fixing the initial value enables the same progression to be obtained every time by at least a digital operation if any operation error dose not occur. In this embodiment 7, the variable signal generator 71 shown in FIG. 14 is configured to perform such an operation.

Figure 29:
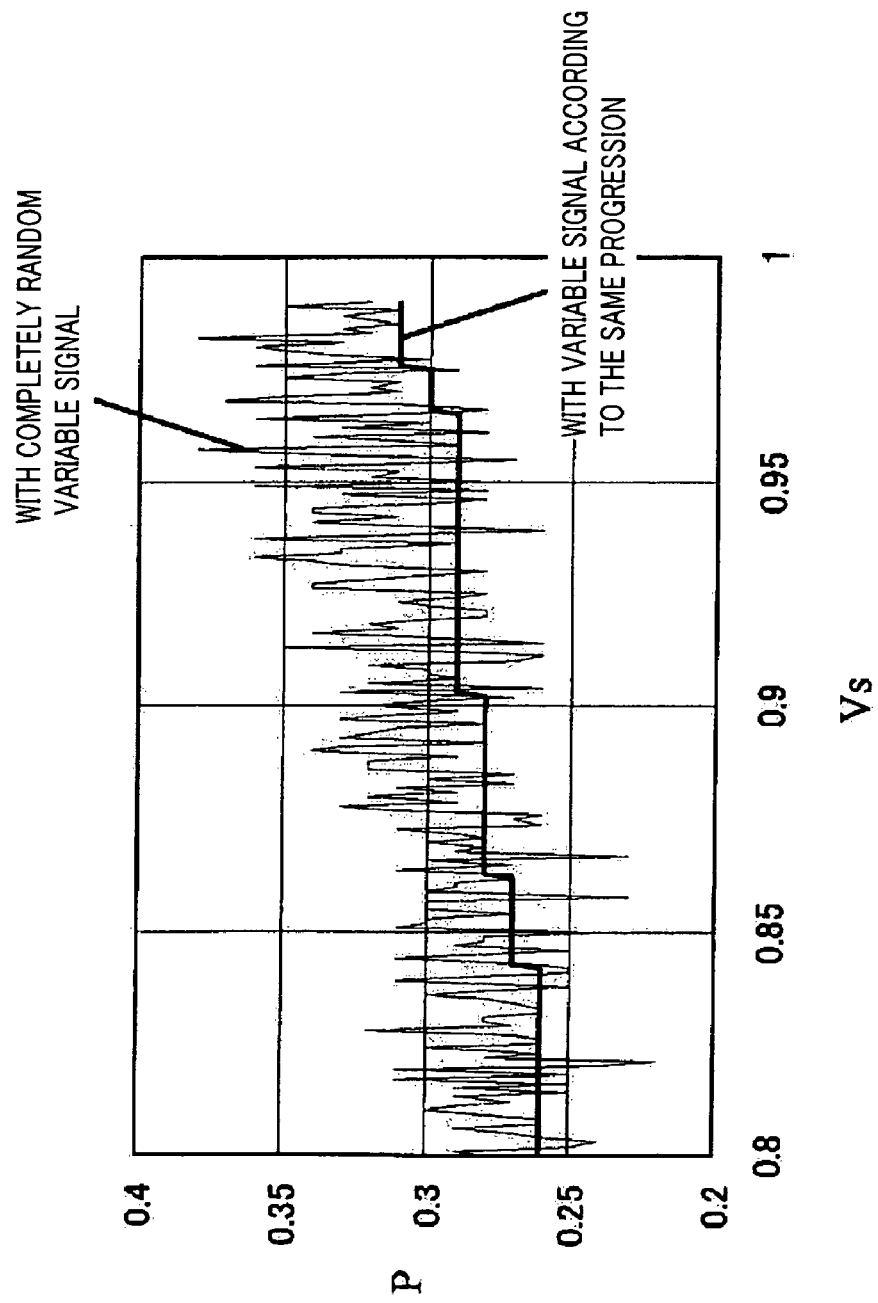
FIG. 29 is a graph showing a difference resulting from an initial value control in the pulse generation probability of a stochastic pulse generator according to embodiment 7 of the present invention by comparison.

FIG. 29 plots pulse generation probabilities obtained by use of the same progression every time and by the use of complete random progression, respectively, any of the progressions being a tent map progression as used in embodiment 4.

The horizontal axis represents signal voltage $V_S$ and the vertical axis represents pulse generation probability P. This graph plots the pulse generation probabilities obtained in an exemplary case where $V_S$ is increased little by little from 0.8 and variable voltage $V_C$ is varied 100 times for each value of $V_S$.

The stochastic pulse generator according this embodiment 7 uses a variable voltage generated according to a tent map and operates so that the pulse generation probability becomes ⅓ as a maximum value when $V_S$=1 for example, as in embodiment 4. However, since the pulse generation probability P is stochastic to the end, some deflection is found relative to complete random variable signals as seen from FIG. 29. This means that $V_S$ does not necessarily assume the maximum when P assumes the maximum.

However, when P was obtained relative to each $V_S$ using the same progression as the variable signal every time, the inventor of the present invention found that P varied stepwise as shown in FIG. 29 and exhibited the characteristic that P generated such that a maximum $V_S$ was included in $V_S$ values assumed when P was at the maximum.

This is because the use of the same progression results in comparison between the same $V_C$ group and the same $V_S$ group every time and hence at least a decrease is not possible in the pulse generation probability obtained when $V_S$ becomes large.

As described above, the stochastic pulse generator of this embodiment is capable of substantially varying its operation by a simple control such as to render variable signals same or different every time With progressions based on mapping in particular, a control to provide such a large variation in operation can be achieved by merely fixing or unfixing the initial value of the progression used.

With complete random control signals, the pulse generation probability P exhibits the characteristic that P is randomly extracted from a relatively large $V_S$ group just stochastically. If such a random characteristic is utilized in Manhattan distance processing for vector matching, a certain vector is randomly extracted from proximate ones. Such an operation is useful when a device is to be configured to perform an operation giving no "boredom" to humans for example.

On the other hand, inputting variable signals of the same progression is a very useful operation method when an accurate operation is required such that when the proximity of a certain number to a very large number of variables is to be found, variables proximate to the certain number is extracted from a group of variables to reliably include at least a correct variable therein.

Embodiment 8

Figure 30:
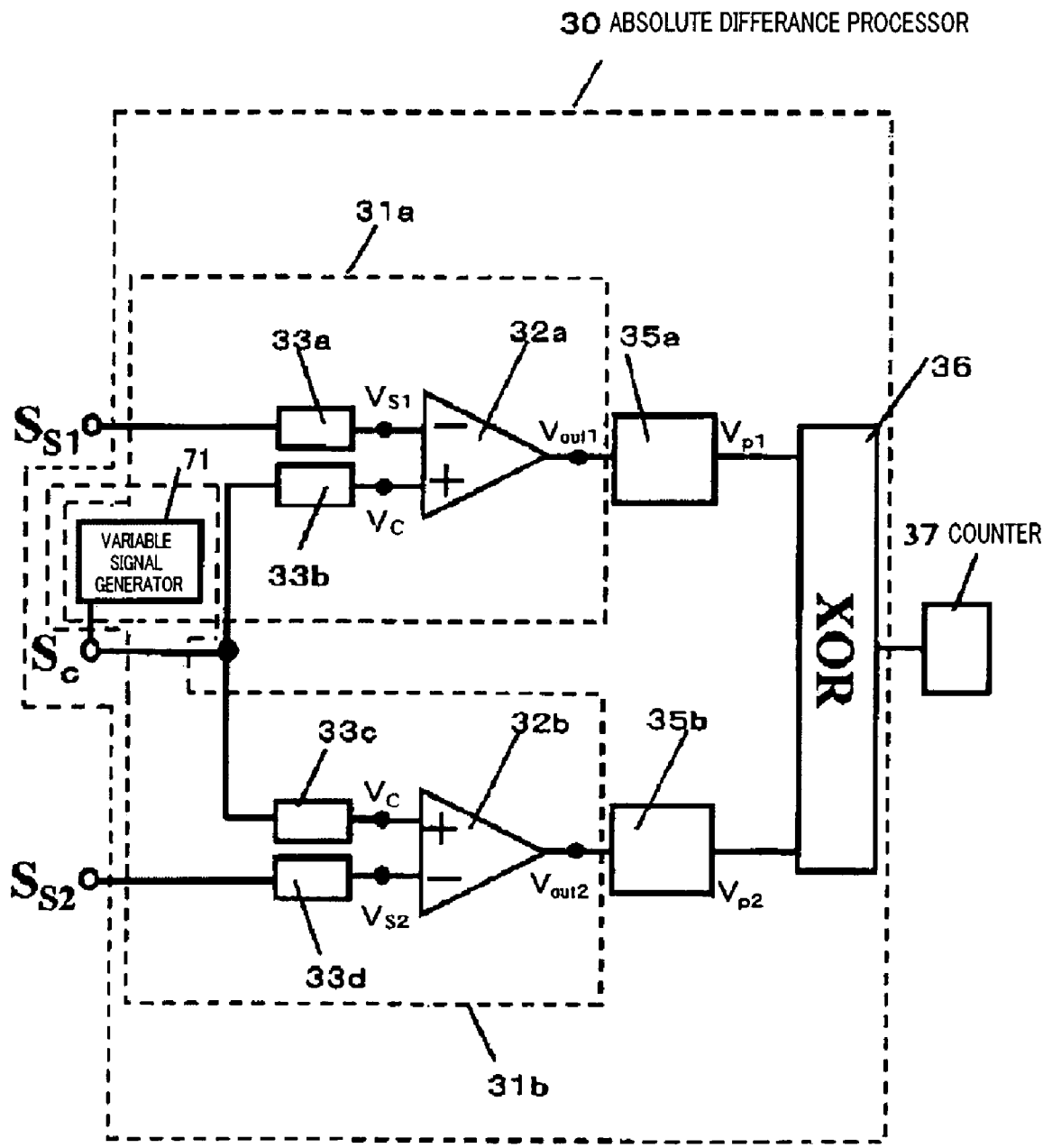
FIG. 30 is a circuit diagram showing an example of the configuration of an absolute difference processor according to embodiment 8 of the present invention.

FIG. 30 is a circuit diagram showing the configuration of an absolute difference processor according to embodiment 8 of the present invention.

In FIG. 30, reference character 30 designates the absolute difference processor. Reference characters 31a and 31b each designate a stochastic pulse generator as described in embodiments 3 to 7. The stochastic pulse generators 31a and 31b are each the same as in embodiment 3 in that the stochastic pulse generator 31a includes variable signal generator 71, comparator 32a and voltage converters 33a and 33b and the stochastic pulse generator 31b includes variable signal generator 71, comparator 32b and voltage converters 33c and 33d. However, the two stochastic pulse generators 31a and 31b share the single variable signal generator 71. The outputs of respective comparators 32a and 32b are $V_{out1}(V_{O1})$ and $V_{out}(V_{O2})$, respectively, which are inputted to edge detector circuits 35a and 35b, respectively. The outputs $V_{P1}$ and $V_{P2}$ of the respective edge detector circuits 35a and 35a are inputted to XOR (exclusive-OR) circuit 36, the output terminal of which is connected to counter 37.

The absolute difference processor according to this embodiment 6 provides the operation of generating stochastic pulses corresponding to the absolute difference between two input signals ($S_{S1}$ and $S_{S2}$) that are present therein.

As shown in FIG. 30, one input signal $S_{S1}$ is inputted to the stochastic pulse generator 31a, while the other input signal $S_{S2}$ inputted to the stochastic pulse generator 31b. On the other hand, the same variable signal $S_C$ is inputted to both of the stochastic pulse generators 32a and 32b.

The operation of the absolute difference processor thus configured will be described with reference to FIG. 31.

Figure 31:
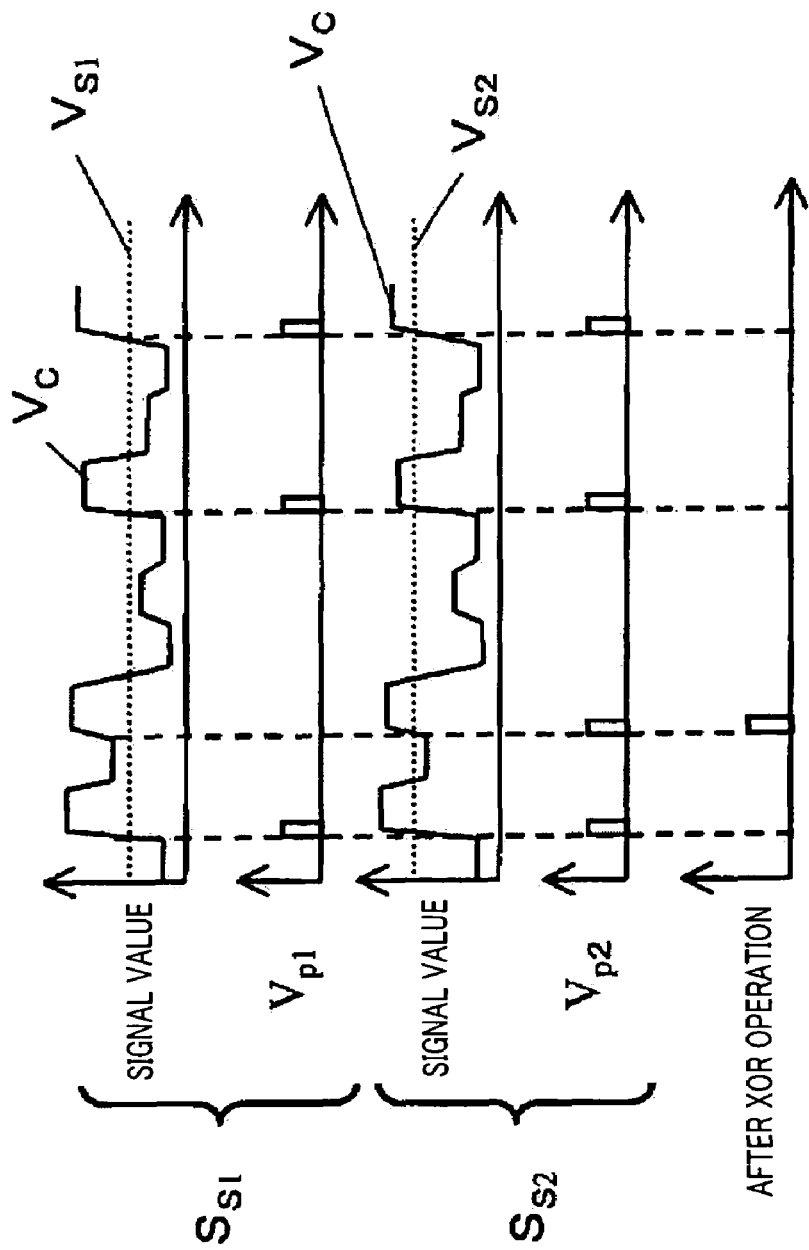
FIG. 31 is a graph showing the principle of the operation of the absolute difference processor shown in FIG. 30.

FIG. 31 is a graph plotting the outputs of respective edge detector circuits 35a and 35b resulting when the same signals $S_C$ are given with respect to two input signals $S_{S1}$ and $S_{S2}$ and the output of the XOR circuit resulting when the outputs of detector circuits 35a and 35b are inputted thereto.

In embodiment 8, description is made of the case where there are used stochastic pulse generators according to embodiment 4.

As shown in FIG. 31, the stochastic pulse generators 31a and 31b generate pulses $V_{P1}$ and $V_{P2}$, respectively, according to embodiment 4, with probabilities corresponding to the magnitudes of respective input voltages $V_{S1}$ and $V_{S2}$ every time the variable voltage $V_C$ is varied.

Since the same signal $V_C$ is inputted to the two stochastic pulse generators 31a and 31b, the pulse generators 31a and 31b generate pulses simultaneously at many occasions if the values of respective input voltages $V_S$ and $V_{S2}$ are close to each other. Accordingly, Low is outputted after XOR operation in many cases.

On the other hand, if only one of the pulse generators (stochastic pulse generator 31b in this case) generates pulse, pulses are outputted after the XOR operation.

That is, as the values of respective voltages $V_{S1}$ and $V_{S2}$ become closer to each other, pulses $V_{P1}$ and $V_{P2}$ are generated more similarly and consequently, an output of pulse occurs after the XOR operation with a lowering probability. On the other hand, as the values of respective voltages $V_{S1}$ and $V_{S2}$ differ from each other more largely, the probability that either of pulses $V_{P1}$ and $V_{P2}$ is generated becomes higher and consequently, an output of pulse occurs after the XOR operation with an increasing probability.

As can be understood from the above description, the absolute difference processor 30 shown in FIG. 30 outputs pulse with a lowering probability as the values of respective input voltages $S_{S1}$ and $S_{S2}$ become closer to each other; that is, the absolute difference processor stochastically outputs pulses corresponding to an absolute difference $S_{S1}-S_{S2}$.

Figure 32:
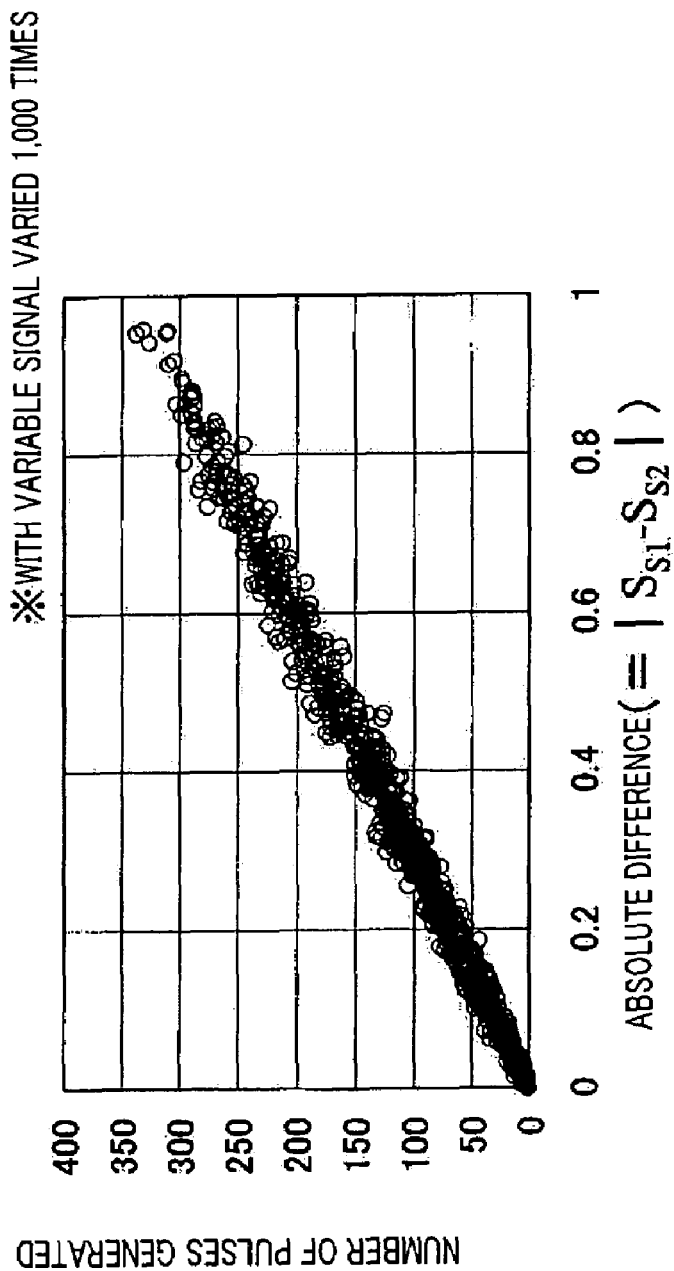
FIG. 32 is a graph showing the outcome of the operation of the absolute difference processor shown in FIG. 30.

FIG. 32 is a graph showing the outcome of the operation of the absolute difference processor according to embodiment 8.

In FIG. 32, the horizontal axis represents the absolute difference between two input signals generated randomly and the vertical axis represents the number of pulses generated in the case where the variable signal is varied 1,000 times (completely randomly).

As shown, the absolute difference can be expressed as a number of stochastic pulses having a very good linear characteristic.

As described above, the absolute difference processor of this embodiment 8 is capable of stochastically obtaining pulses corresponding to an absolute difference by the operations including: inputting two input signals to respective of the two stochastic pulse generators, inputting the same variable signal to the two stochastic pulse generators, and executing an XOR operation for the outputs of the respective pulse generators.

It is needless to say that the pulse generation probability relative to an absolute difference can be varied stepwise by the use of the same progression as the variable signal as in embodiment 7.

Embodiment 9

Embodiment 9 of the present invention is an example of a Manhattan distance processing apparatus.

Figure 33:
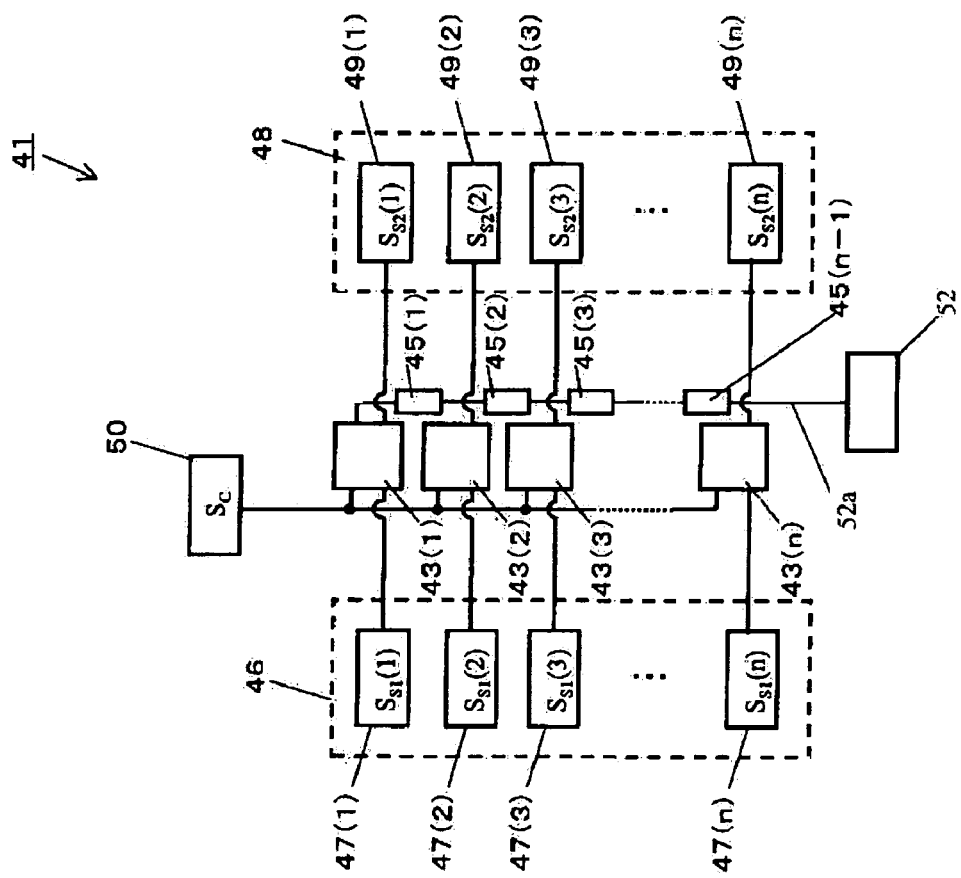
FIG. 33 is a block diagram showing the configuration of a Manhattan distance processing apparatus according to embodiment 9 of the present invention.
Figure 34:
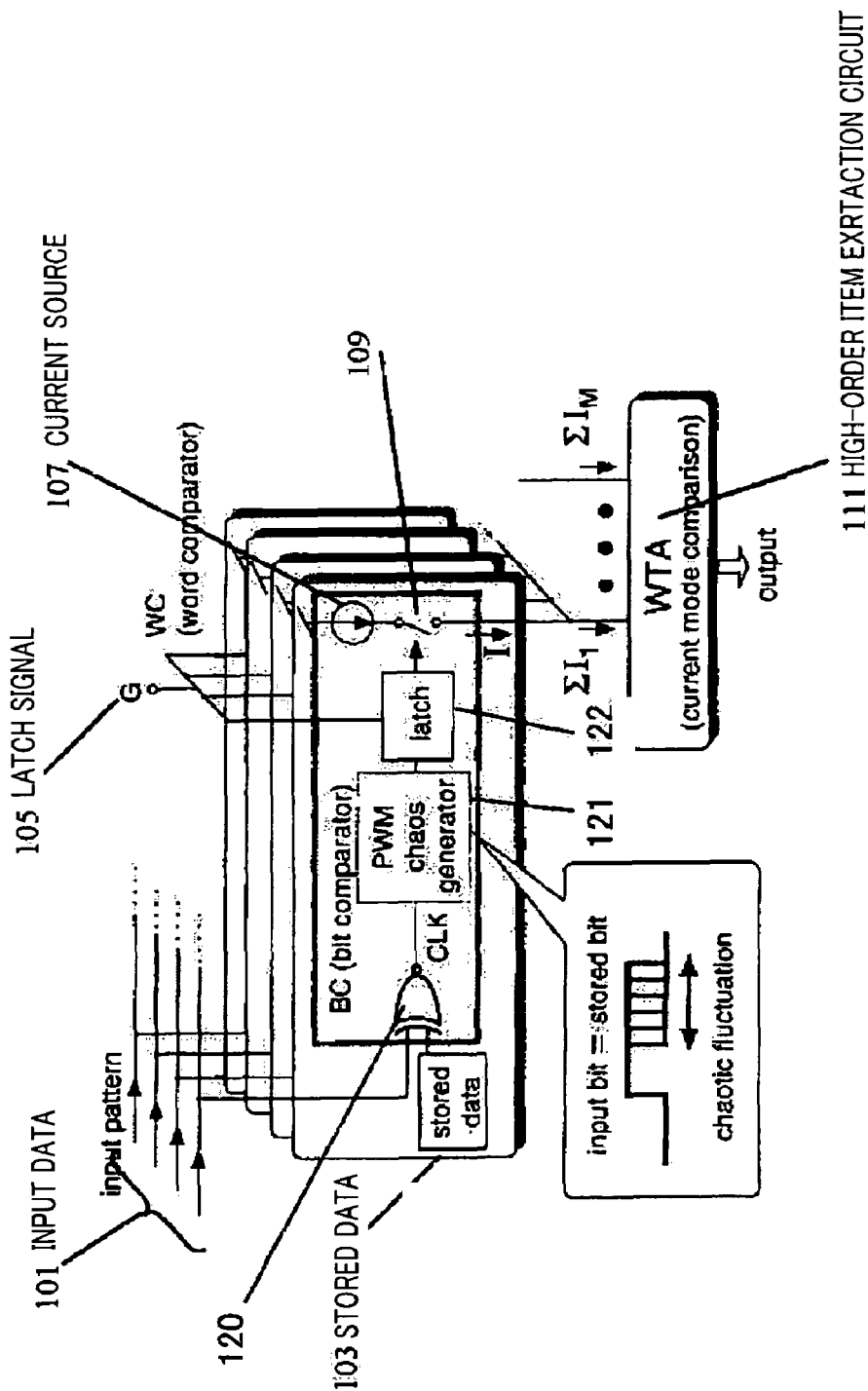
FIG. 34 is a schematic diagram showing the configuration of a distance processing apparatus according to the second conventional art.
Figure 35:
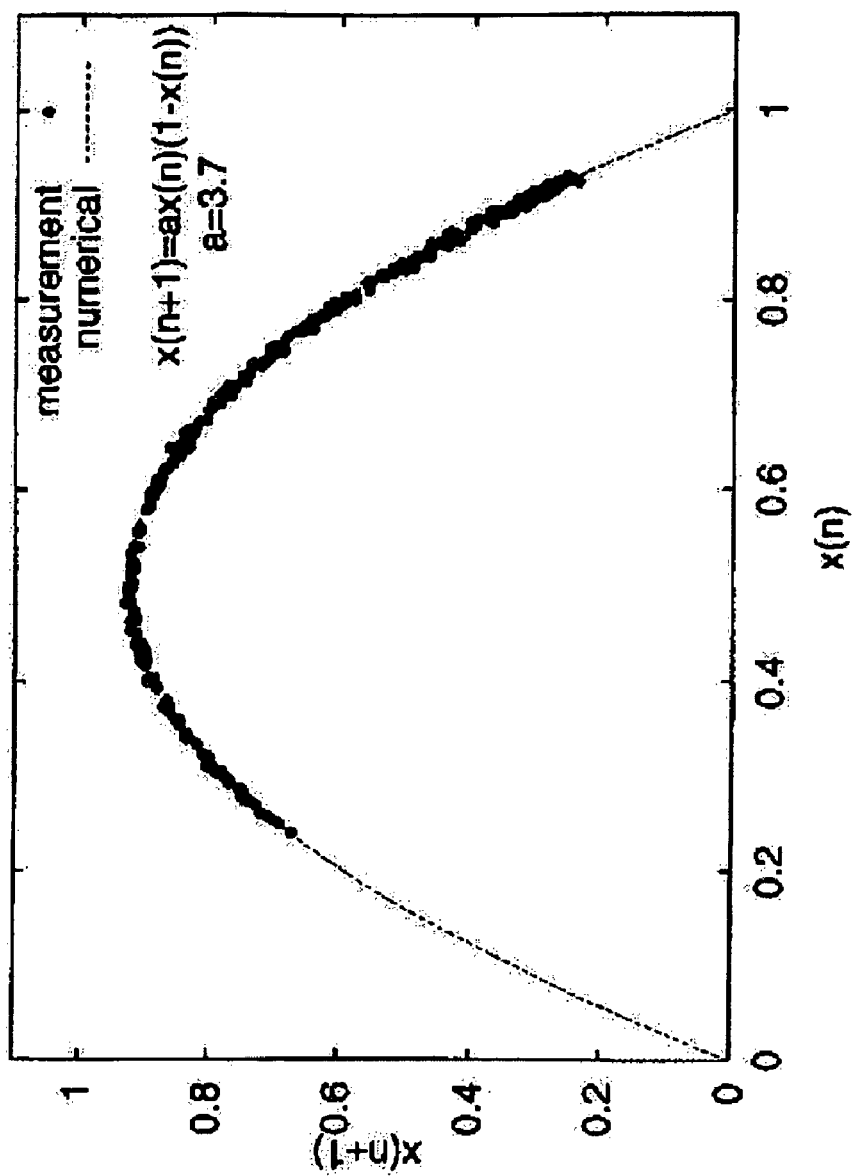
FIG. 35 is a schematic diagram illustrating logistic chaos causing a stochastic operation to occur according to the second conventional art.

FIG. 33 is a circuit diagram showing the configuration of the Manhattan distance processing apparatus according to embodiment 9.

In FIG. 33, Manhattan distance processing apparatus 41 has n absolute difference processors 43(1) to 43(n). Variable signal $S_C$ is inputted to the absolute difference processors 43(1) to 43(n) from shared variable signal generator 50. Further, input signals $S_{S1}(1)$ to $S_{S1}(n)$ and input signals $S_{S2}(1)$ to $S_{S2}(n)$, which correspond to elements of two vectors 46 and 48, are inputted to the absolute difference processors 43(1) to 43(n). The output terminals of the respective absolute difference processors 43(1) to 43(n) are connected to common wiring 52a having one end connected to counter 52. The wiring 52a is provided with delay circuits 45(1) to 45(n-1) each located intermediate the connecting portions between the output terminals of each pair of adjacent absolute difference processors and the wiring 52*a*.

The vector 46 has n elements and comprises n values (signals) 47(1) to 47(n) corresponding to these elements. The other vector 48 has n elements and comprises n values (signals) 49(1) to 49(n) corresponding to these elements.

The delay circuits 45(1) to 45(n-1) of this embodiment 9 each have a delay time twice as long as delay time $\tau$ of the delay circuit described in embodiment 3.

Description will be made of the operation of the Manhattan distance processing apparatus thus configured according to embodiment 9 with reference to FIG. 33.

Signals $S_{S1}(i)$ and $S_{S2}(i)$ having the same element number as the vectors 46 and 48 are inputted to the absolute difference processor 43(i).

In response thereto, input voltages $V_{S1}$ and $V_{S2}$ according to respective input signals $S_{S1}(i)$ and $S_{S2}(i)$ are inputted to the associated comparator, as in the operation of the absolute difference processor of embodiment 8. All the absolute difference processors 43(1) to 43(n) perform the aforementioned operation. As a result, in response to a certain variable signal $S_C$ inputted from the variable signal generator 50 to each of the absolute difference processors 43(1) to 43(n), the absolute difference processors 43(1) to 43(n) each output pulse with a probability proportional to the Manhattan distance between $S_{S1}(i)$ and $S_{S2}(i)$.

The pulse thus outputted reaches the counter 52 via each delay circuit 45. Since the delay time of each delay circuit 45 is $2\tau$, which is twice as long as pulse width $\tau$ in this embodiment 9, the pulses outputted from respective absolute difference processors 43(1) to 43(n) reach the counter 52 without overlapping each other in terms of time, whereby the counter 52 can count the number of the pulses accurately.

After lapse of a time period for counting all the pulses, varying the variable signal $S_C$ allows pulse generation to occur in the same manner.

The operation thus described causes each of the absolute difference processors to generate pulses corresponding to the absolute difference between vector elements in each pair. For this reason, the Manhattan distance processing apparatus of this embodiment 9, as a whole, can obtain the number of pulses corresponding to the Manhattan distance between the two vectors at the counter 53.

It is needless to say that parallel expansion of such a structure will enable matching between an input vector and an enormous number of reference vectors in the same manner as described above.

By virtue of such a Manhattan distance processing apparatus, a vector matching operation, which would otherwise require a very lengthy time and much energy in the case of digital operation, can be executed at lower power consumption.

In this embodiment 9 particularly, since the same variable signal is inputted to all the absolute difference processors, the apparatus assures that vectors having the shortest Manhattan distance are necessarily included in a group of vectors having the lowest pulses count, which is obtained when the numbers of pulses counted by the counter 52 are compared to each other, owing to the same effect as obtained by the inputting of the same progression described in embodiment 5.

Thus, even when an enormous number of vector columns (reference vectors ) are present, the Manhattan distance processing apparatus of the present invention can substantially reduce the number of selected vector columns because the selected vector columns include a correct vector. Thus, even though a digital operation for example is required for precise Manhattan distance processing after the processing by the apparatus of the present invention, higher-speed Manhattan distance processing can be realized at lower power consumption, with all things considered.

While this embodiment 9 uses the delay method for allowing pulses simultaneously outputted from the respective absolute difference processors to be counted, it is needless to say that another method such as to charge capacitors with the pulses can provide the same capability.

Summary of Embodiments 3 to 9

As described above, the present invention is directed to the configuration of a stochastic pulse generator, a variable signal for use in the operation thereof, an absolute difference processor employing the stochastic pulse generator, and an intervector Manhattan distance processing apparatus employing the absolute difference processor.

The stochastic pulse generator of the present invention, despite its simple circuit configuration, is capable of obtaining a number of stochastic pulses corresponding to the magnitude of an input signal by converting a variable signal and the input signal to respective optimum voltage values, inputting these values to the comparator to cause pulse generation to occur, and counting the generated pulses. By virtue of this capability the stochastic pulse generator provide for a device which is capable of directly expressing the magnitude of an analog signal as a number of stochastic pulses without converting the analog signal to a digital value.

The use of a variable signal based on tent map chaos or Bernoulli shift map for controlling the pulse generation of this stochastic pulse generator is particularly effective in view of the characteristic that the pulse generation probability linearly corresponds to the input signal. Thus, the characteristics of the stochastic pulse generator can be controlled more effectively. Since the capability can be provided of converging the input signal into a pulse generation probability proportional to the value or magnitude of the input signal by merely increasing the number of variations of the variable signal without any particular need of other complicated control, a precision of calculation is ensured in processing for comparison between a number of pulses and another number of pulses after the pulses counts have been obtained. Thus, a highly useful capability can be provided.

Also, description has been made of the feature that the randomness in the number of pulses generated can be controlled based on whether the variable signal comprises complete random signals or the same progression is used as the variable signal at least for every input signal. Notwithstanding the fact that such a control is very simple, the use of the same progression, in particular, can assure that a group of largest pulses counts necessarily includes the largest input signal without inversion of each number of pulses when input signals are compared to each other as to their magnitude. The use of the same progression is particularly effective when the largest or smallest value is extracted by a mathematical operation such as absolute difference processing or Manhattan distance processing.

On the other hand, the use of complete random progression enables random extraction of a value or vector proximate to a certain value or vector from a group of proximate ones in the case where selection of the same thing is not preferred, for example, in the case of vector matching of information about human's emotion.

The absolute difference processor employing such a stochastic pulse generator is capable of generating pulses corresponding to an absolute difference, despite its simple structure comprising two stochastic pulse generators and an XOR logic circuit. The absolute difference processor is very useful from the viewpoint of the advantage that the configuration of a Manhattan distance processing apparatus employing this absolute difference processor in particular can be simplified.

The Manhattan distance processing apparatus according to the present invention is capable of drastically reducing the amount of operations required to be performed by digital LSI and hence is of great industrial contribution by virtue of its capability of reducing the number of proximate vectors in view of the situation of the present digital LSI society where the amount of information processing for finding vectors that are the closest to or the most distant from each other, such as MPEG image compression, image recognition or voice recognition, is becoming enormous.

It will be apparent from the foregoing description that many improvements and other embodiments of the present invention occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The stochastic pulse generator according to the present invention is useful as an industrially-applicable stochastic pulse generator.

The absolute difference processor according to the present invention is useful as an absolute difference processor for use in a Manhattan distance processing apparatus and the like.

The Manhattan distance processing apparatus according to the present invention is useful as a Manhattan distance processing apparatus for use in an information processing apparatus and the like.

The stochastic pulse generator driving method according to the present invention is useful as a driving method for an industrially-applicable stochastic pulse generator.

The invention claimed is:

1. An absolute difference processor comprising first and second stochastic pulse generators each comprising
a variable signal generator operative to generate a variable signal which varies randomly, and a comparator operative to output a binary signal of High or Low depending on which of one input signal and another input signal is larger or smaller than the other, wherein
when the variable signal is inputted as said one input signal to the comparator from the variable signal generator, the comparator stochastically outputs pulses, the number of which corresponds to a magnitude of said another input signal; and
an exclusive-OR circuit for outputting an exclusive-OR of an output of the first stochastic pulse generator and an output of the second stochastic pulse generator; wherein
when said another input signal and the variable signal which are inputted to the first stochastic pulse generator are $V_{S1}$ and $V_{C1}$, respectively, while the output of the first stochastic pulse generator is $V_{O1}$, and said another input signal and the variable signal which are inputted to the second stochastic pulse generator are $V_{S2}$ and $V_{C2}$, respectively, while the output of the second stochastic pulse generator is $V_{O2}$, the variable signals $V_{C1}$ and $V_{C2}$ are the same variable signal:
thereby obtaining an absolute difference between the value of said another input signal $V_{S1}$ and that of said another input signal $V_{S2}$ in the form of a number of stochastic pulses comprising the exclusive-OR.

2. The absolute difference processor according to claim 1, wherein the stochastic pulses comprising the exclusive-OR are generated with a pulse generation probability which lowers with decreasing absolute difference between the value of said another input signal $V_{S1}$ and that of said another input signal $V_{S2}$.

3. The absolute difference processor according to claim 1, wherein the variable signals $V_{C1}$ and $V_{C2}$ are generated to repeat the same progression.

4. A Manhattan distance processing apparatus comprising a plurality of absolute difference processors as recited in claim 1 which are connected in parallel with the single variable signal generator, wherein
signals corresponding to elements of respective of two vectors each having the elements, a number of which corresponds to the number of the absolute difference processors, are inputted as said another input signal $V_{S1}$ and said another input signal $V_{S2}$ to each of the absolute difference processors,
thereby obtaining a Manhattan distance between the two vectors in the form of number of stochastic pulses.

* * * * *

UNITED STATES PATENT AND TRADEMARK OFFICE
CERTIFICATE OF CORRECTION

PATENT NO. : 7,449,967 B2
APPLICATION NO. : 10/532993
DATED : November 11, 2008
INVENTOR(S) : Michihito Ueda It is certified that error appears in the above-identified patent and that said Letters Patent is hereby corrected as shown below:

On the title page of the patent, in Item "(56) References Cited", below the data listed under "FOREIGN PATENT DOCUMENTS" and before the Examiner Information insert the following:

-- OTHER PUBLICATIONS

"YAMANAKA et al.; "A CMOS Stochastic Associative Processor Using PWM Chaotic Signals"; IEICE Trans. Electron.; c. 2001; Vol. E84, No. 12; pp. 1723 - 1729" --

In the claims, in Column 24, Line 4 (Claim 1), change "generator. the" to -- generator, the --.

Signed and Sealed this

Fourteenth Day of April, 2009

JOHN DOLL
*Acting Director of the United States Patent and Trademark Office*